(12) United States Patent
Sim

(10) Patent No.: US 9,875,897 B2
(45) Date of Patent: Jan. 23, 2018

(54) SEMICONDUCTOR DEVICE AND METHOD OF FABRICATING THE SAME

(71) Applicant: SAMSUNG ELECTRONICS CO., LTD., Suwon-si, Gyeonggi-Do (KR)

(72) Inventor: Jae-Hwang Sim, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/335,190

(22) Filed: Oct. 26, 2016

(65) Prior Publication Data

US 2017/0178907 A1 Jun. 22, 2017

(30) Foreign Application Priority Data

Dec. 18, 2015 (KR) ........................ 10-2015-0181851

(51) Int. Cl.

| | |
|---|---|
| *H01L 21/033* | (2006.01) |
| *H01L 23/522* | (2006.01) |
| *H01L 27/11524* | (2017.01) |
| *H01L 27/11529* | (2017.01) |
| *H01L 27/11531* | (2017.01) |
| *H01L 27/1157* | (2017.01) |
| *H01L 27/11573* | (2017.01) |
| *H01L 29/06* | (2006.01) |

(52) U.S. Cl.
CPC ...... *H01L 21/0338* (2013.01); *H01L 21/0332* (2013.01); *H01L 21/0335* (2013.01); *H01L 21/0337* (2013.01); *H01L 23/5226* (2013.01); *H01L 27/1157* (2013.01); *H01L 27/11524* (2013.01); *H01L 27/11529* (2013.01); *H01L 27/11531* (2013.01); *H01L 27/11573* (2013.01); *H01L 29/0649* (2013.01)

(58) Field of Classification Search
CPC ............. H01L 21/0337; H01L 21/3086; H01L 21/3088; H01L 21/0338; H01L 21/0332; H01L 21/3081; H01L 21/31144; H01L 21/32139; H01L 21/0217; H01L 21/02186; H01L 27/11524; H01L 27/11529; H01L 21/0335; H01L 27/1157; H01L 27/11573; H01L 27/11531; H01L 29/0649; H01L 23/5226

See application file for complete search history.

(56) References Cited

U.S. PATENT DOCUMENTS

| | | |
|---|---|---|
| 8,216,949 B2 | 7/2012 | Abatchev et al. |
| 8,450,833 B2 | 5/2013 | Kim |
| 8,835,321 B2 | 9/2014 | Ha |
| 8,836,083 B2 | 9/2014 | Zhou |

(Continued)

FOREIGN PATENT DOCUMENTS

| | | |
|---|---|---|
| JP | 2009139695 A | 6/2009 |
| JP | 2015095501 A | 5/2015 |

*Primary Examiner* — Roy Potter
*Assistant Examiner* — Paul Patton
(74) *Attorney, Agent, or Firm* — Volentine & Whitt, PLLC

(57) ABSTRACT

A semiconductor device includes line patterns extending in a first direction, and separated from each other in a second direction perpendicular to the first direction. The plurality of line patterns includes at least two line sets, and each of the line sets includes four line patterns consecutively disposed in the second direction and having a length which varies based on location, and the at least two line sets have substantially an identical length.

17 Claims, 40 Drawing Sheets

(56) References Cited

U.S. PATENT DOCUMENTS

| | | |
|---|---|---|
| 8,921,034 B2 | 12/2014 | Hopkins |
| 2010/0327396 A1* | 12/2010 | Park .................... H01L 27/0207 |
| | | 257/506 |
| 2013/0256761 A1* | 10/2013 | Sim ..................... H01L 27/0207 |
| | | 257/208 |
| 2014/0363963 A1 | 12/2014 | Kiyotoshi |
| 2015/0126042 A1 | 5/2015 | Pasquale et al. |
| 2015/0162205 A1 | 6/2015 | Wu et al. |

* cited by examiner

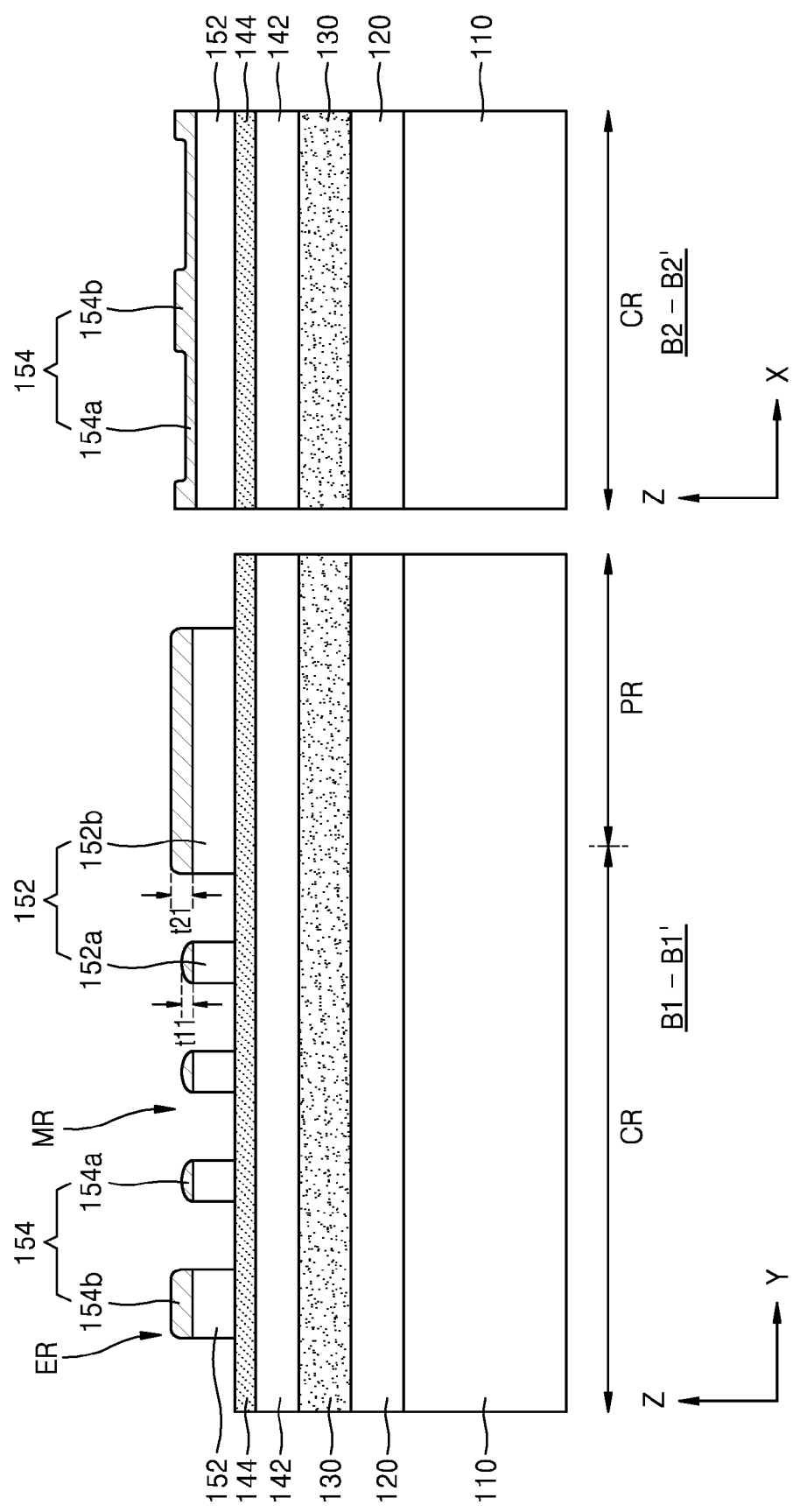

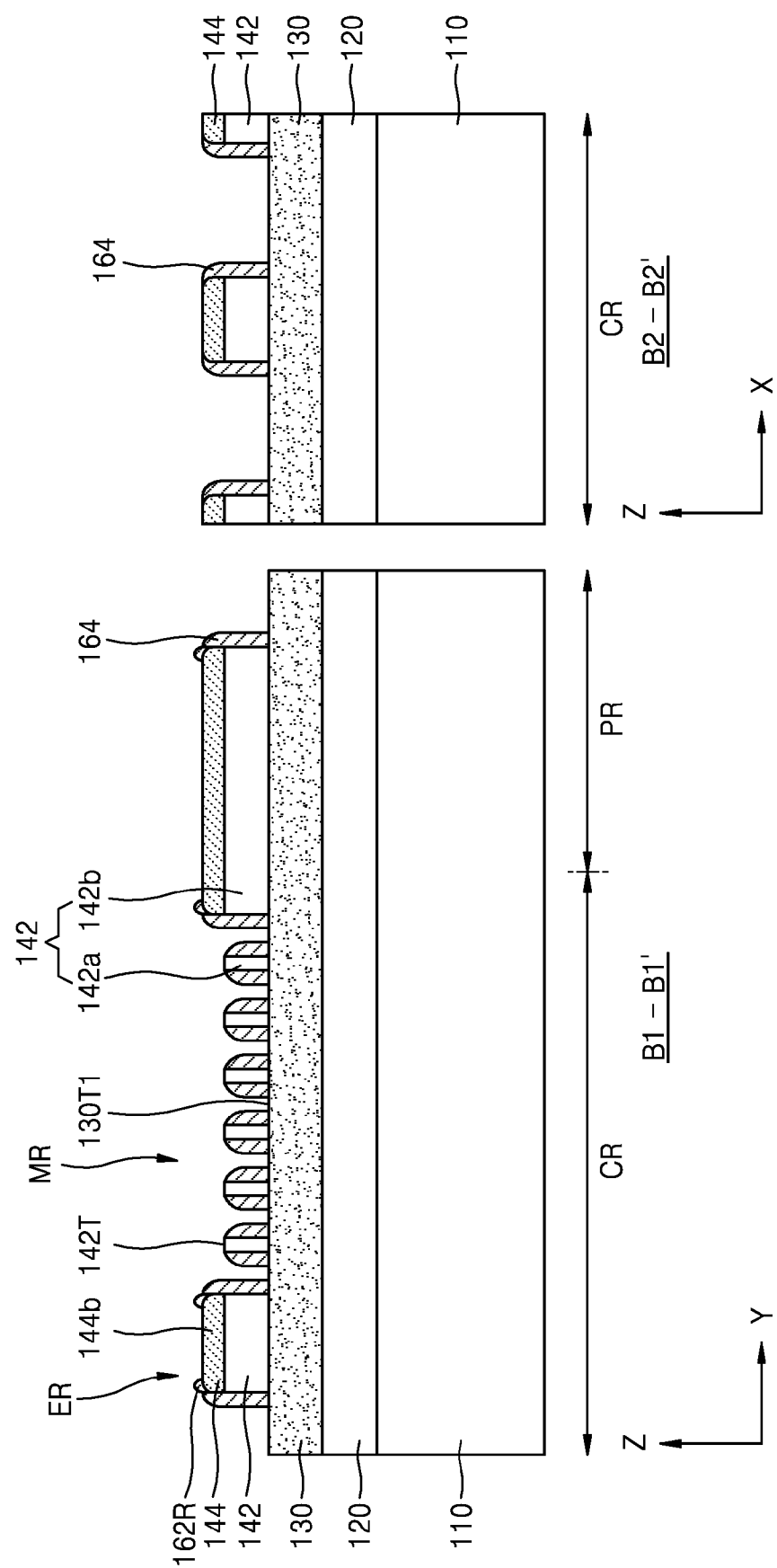

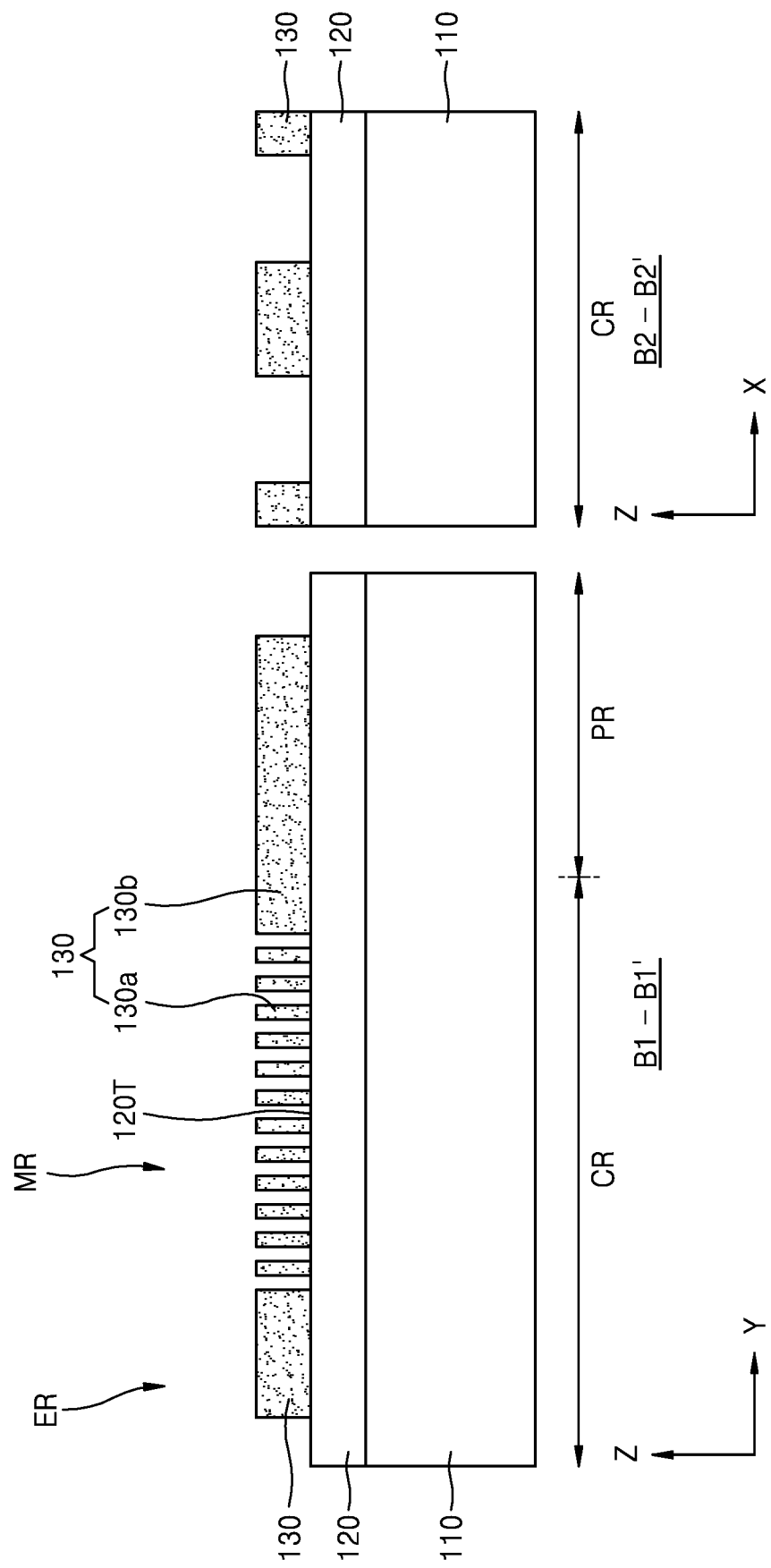

SEMICONDUCTOR DEVICE AND METHOD OF FABRICATING THE SAME

PRIORITY STATEMENT

This application claims the benefit of Korean Patent Application No. 10-2015-0181851, filed on Dec. 18, 2015, in the Korean Intellectual Property Office, the disclosure of which is hereby incorporated by reference in its entirety.

BACKGROUND

The inventive concept relates to a semiconductor device and a fabrication method thereof, and more particularly, to a method of fabricating a semiconductor device including a plurality of line patterns mutually extending in parallel.

In line with a trend of electronic products becoming lighter, thinner, and smaller in general, manufacturing techniques have evolved to form the fine patterns, e.g., circuit patterns, of the electronic devices that make such products. In particular, a fine pattern forming technology such as double patterning technology or quadruple patterning technology is being developed to form fine patterns of electronic devices which may be referred to in the art as semiconductor devices.

SUMMARY

According to an aspect of the inventive concept, there is provided a semiconductor device including a plurality of line patterns, all of the line patterns extending longitudinally in a first direction so as to each have a length in the first direction, and the line patterns spaced from each other in a second direction perpendicular to the first direction, and in which the plurality of line patterns include at least two respective sets of the line patterns, each of the sets including four of the line patterns consecutively disposed in the second direction, in which the lengths of the line patterns in each of the sets vary, and in which the sets of line patterns have substantially identical lengths.

According to another aspect of the inventive concept, there is provided a semiconductor device including a plurality of isolation regions defining a plurality of line-shaped active regions, all of the active regions extending longitudinally in a first direction so as to each have a length in the first direction, and in which the plurality of active regions includes at least two respective sets of the active regions, each of the sets of active regions includes four of the active regions consecutively disposed in a second direction perpendicular to the first direction, in which the lengths of the active regions in each of the sets thereof vary, and in which the sets of active region have substantially identical lengths.

According to another aspect of the inventive concept, there is provided a semiconductor device comprising a memory cell array and a peripheral circuit transistor disposed laterally of the memory cell array, and in which the memory cell array includes an active region and a trench isolation structure, the active region having at least one group of parallel linear sections each of which extends longitudinally in a first direction and is delimited by two linear side portions of the trench isolation structure, the linear sections of the active regions being spaced from one another in a second direction perpendicular to the first direction, and the group of the linear sections of the active region including at least two respective sets of the linear sections, in which the sets have identical configurations of four of the linear sections of the active region consecutively disposed in the second direction, and in which the lengths of the side portions of the trench isolation structure delimiting the four linear sections, in each set thereof, varying, such that a length of at least one of the four linear sections in each set thereof differs from a length of at least one of the other linear sections in the set.

According to still another aspect of the inventive concept, there is provided a method of fabricating a semiconductor device including sequentially forming a target layer and a first material layer on a substrate including a cell region and a peripheral circuit region, forming a second material layer pattern including a first portion repeatedly formed with a constant reference pitch on the first material layer in the cell region, and a second portion disposed to surround the first portion and having a width wider than the first portion, forming a first spacer covering both side walls of the second material layer pattern, exposing a top surface of the first layer by removing the second material layer pattern, etching the first material layer using the first spacer as an etching mask to form a first material layer pattern, forming a second spacer covering both side walls of the first material layer pattern, removing the first material layer pattern, and etching the target layer using the second spacer as an etching mask to form a plurality of line patterns so that the plurality of line patterns includes at least two line sets. Each of the line sets includes four line patterns consecutively disposed in the second direction and having a length which varies based on location, and the at least two line sets have substantially an identical length.

BRIEF DESCRIPTION OF THE DRAWINGS

The inventive concept will be more clearly understood from the following detailed description taken in conjunction with the accompanying drawings in which:

FIGS. 1A to 13C are plan and sectional views of a semiconductor device during the course of its manufacture and together illustrate examples of a method of fabricating the semiconductor device according to the inventive concept, wherein FIG. 1A, FIG. 2A, FIG. 3A, FIG. 4A, FIG. 5A, FIG. 6A, FIG. 7A, FIG. 8A, FIG. 9A, FIG. 10A, FIG. 11A, FIG. 12A, and FIG. 13A are the plan views, FIG. 1B, FIG. 2B, FIG. 3B, FIG. 4B, FIG. 5B, FIG. 6B, FIG. 7B, FIG. 8B, FIG. 9B, FIG. 10B, FIG. 11B, FIG. 12B, and FIG. 13B are cross-sectional views each taken along a line B1-B1' and a line B2-B2' in FIG. 1A, FIG. 2A, FIG. 3A, FIG. 4A, FIG. 5A, FIG. 6A, FIG. 7A, FIG. 8A, FIG. 9A, FIG. 10A, FIG. 11A, FIG. 12A, and FIG. 13A respectively, and FIG. 13C is an enlarged view of portion C of FIG. 13A;

FIGS. 14A to 17C are plan views and cross-sectional views of a semiconductor device during the course of its manufacture and together illustrate examples of a method of fabricating a semiconductor according to the inventive concept, wherein FIG. 14A, FIG. 15A, FIG. 16A, and FIG. 17A are the plan views, FIG. 17C is an enlarged view of portion C of FIG. 17A;

DETAILED DESCRIPTION OF THE EXAMPLES

Figure 1A:
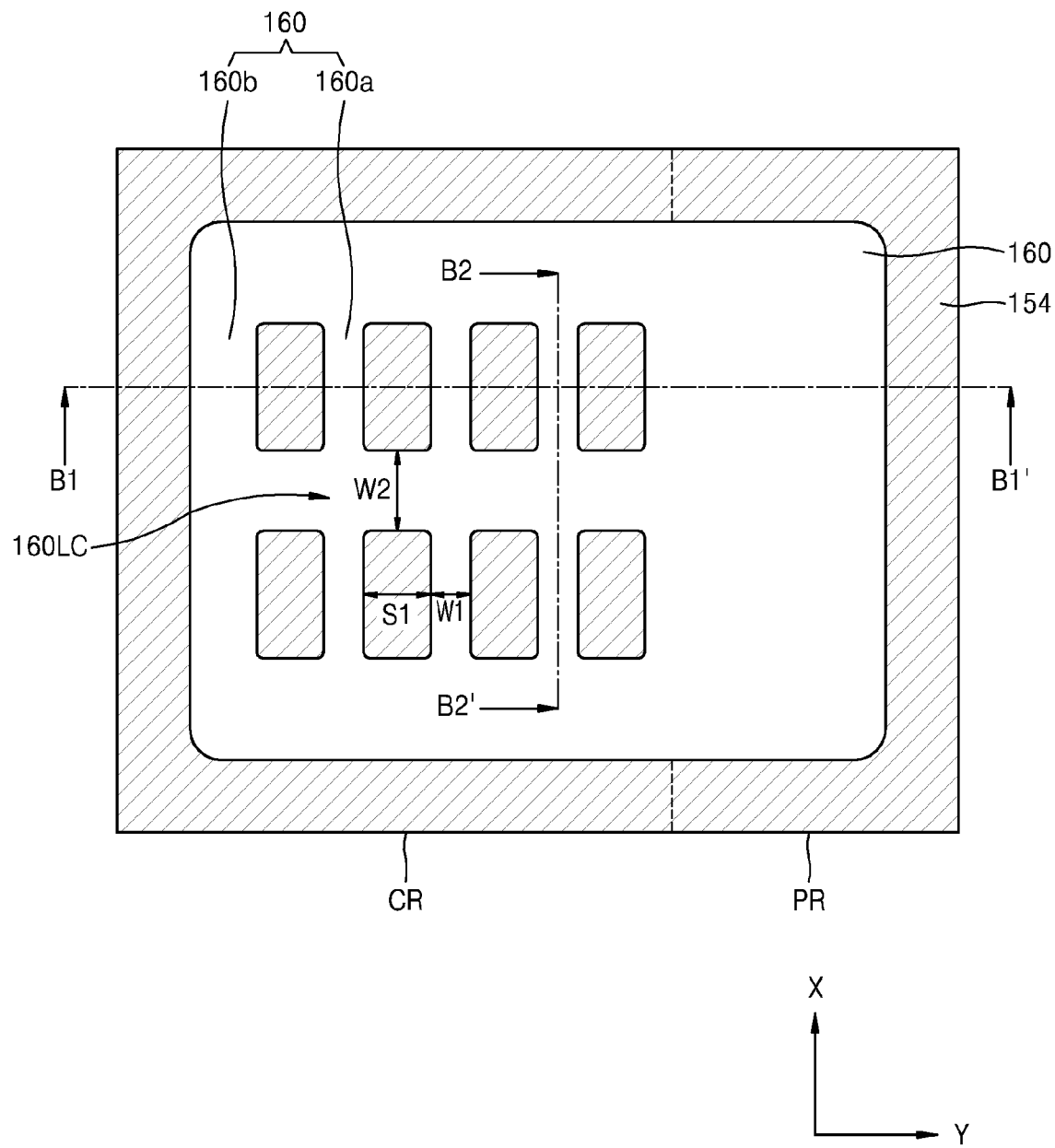

The objects, effects, features, and advantages of the inventive concept may be easily understood through the accompanying drawings and relevant examples of the inventive concept described in detail below. The inventive concept may, however, be embodied in many different forms and should not be construed as being limited to the examples set forth herein; rather, these examples are provided so that this disclosure will be thorough and complete, and will fully convey the inventive concept to those skilled in the art. In the drawings, the sizes and relative sizes of layers and regions may be exaggerated for clarity.

FIGS. 1A to 13C illustrate examples of a method of fabricating a semiconductor device 100 according to the inventive concept.

Figure 1B:
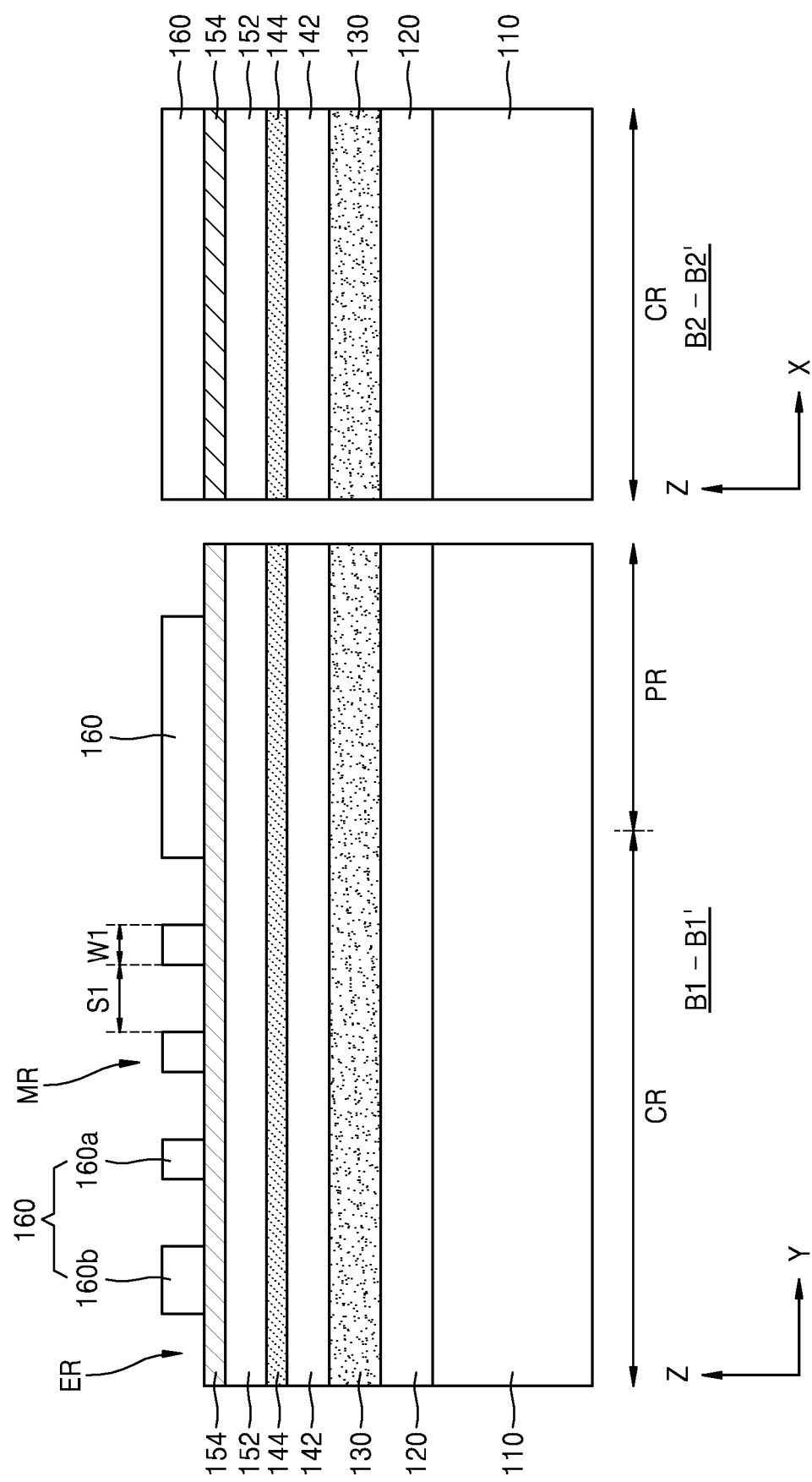

Referring to FIGS. 1A and 1B, a target layer 120, a first mask layer 130, a first material layer 142, a second mask layer 144, a second material layer 152, and a third mask layer 154 may be sequentially formed on a substrate 110.

The substrate 110 may include a semiconductor substrate. In examples, the substrate 110 may be a silicon (Si) or Germanium (Ge) substrate. In other examples, the substrate 110 may include a compound semiconductor such as silicon germanium (SiGe), silicon carbide (SiC), gallium arsenide (GaAs), indium arsenide (InAs), or indium phosphide (InP). In still other examples, the substrate 110 may have a silicon-on-insulator (SOI) structure. The substrate 110 may include a conductive region, for example, a well doped with an impurity or a structure doped with the impurity. Further, the substrate 110 may have an isolation structure such as a shallow trench isolation (STI) structure.

The device may include a cell region CR and a peripheral circuit region PR. In FIG. 1A, the cell region CR is shown as being disposed at a left side of the substrate 110, and the peripheral circuit region PR is shown as being disposed at a right side of the substrate 110 as an example, but examples of the inventive concept are not limited thereto. Alternatively, the cell region CR may be disposed at a center of the substrate 110, and the peripheral circuit region PR may be disposed along the periphery of the substrate 110 to surround the cell region CR.

The target layer 120 may be disposed on the substrate 110. The target layer 120 may be a feature layer desired to be finally patterned in a subsequent process. The target layer 120 may include an insulating material or a conductive material. For example, the target layer 120 may include a metal, an alloy, a metallic carbide, a metallic nitride, a metallic oxynitride, a metallic oxycarbide, a semiconductor, polysilicon, an oxide, a nitride, an oxynitride, a hydrocarbon compound, or a combination thereof, but is not limited thereto. Furthermore, the target layer 120 may include the same material as the substrate 110 or a different material from the substrate 110. When the target layer 120 includes a different material from the substrate 110, the target layer 120 and the substrate 110 may have the same etching rate or may have a different etching rate from each other.

Selectively, an additional material layer (not shown) may be further formed on the substrate 110 so as to be interposed between the substrate 110 and the target layer 120.

The first mask layer 130 may be formed on the target layer 120. The first mask layer 130 may include a metal, an alloy, a metallic carbide, a metallic nitride, a metallic oxynitride, a metallic oxycarbide, a semiconductor, polysilicon, an oxide, a nitride, an oxynitride, a hydrocarbon compound, or a combination thereof, but is not limited thereto. The first mask layer 130 may include a material having a sufficient etch selection ratio with the target layer 120. For example, when the target layer 120 includes polysilicon, the first mask layer 130 may have a stacked structure of a polysilicon oxide layer and a polysilicon layer sequentially formed on the target layer 120. Alternatively, when the target layer 120 includes polysilicon, the first mask layer 130 may consist of a silicon oxide layer.

The first material layer 142 may be formed on the first mask layer 130. The first material layer 142 may include a carbon-based material layer. For example, the first material layer 142 may include an amorphous carbon layer (ACL) or a spin-on hardmask (SOH) material. The SOH material may include a hydrocarbon compound or its derivatives having a relatively high carbon content in the range of 85 to 99 weight % with respect to the total weight of the SOH material. However, examples of the present invention are not limited thereto.

In an exemplary process of forming the first material layer 142 using the SOH material, an organic compound layer having a thickness in the range of 1000 to 5000 Å may be formed on the first mask layer 130 by a spin coating process. The organic compound may include a hydrocarbon compound including an aromatic ring such as phenyl, benzene, or naphthalene, or its derivatives. The organic compound may include a material having a relatively high carbon content in the range of 85 to 99 weight % with respect to a total weight thereof. The organic compound layer may be initially baked at a temperature in the range of 150 to 350° C. to form a carbon-containing layer. The primary baking may be performed for a period of time in the range of 30 to 300 seconds. Then, the carbon-containing layer may be secondarily baked at a temperature in the range of 300 to 550° C. for a period of time in the range of 30 to 300 seconds to harden it. By hardening the carbon-containing layer by performing the baking processes twice, when other material is formed on the carbon-containing layer and even when a deposition process is performed under a relatively high temperature of about 400° C. or more, the carbon-containing layer may not be damaged during the deposition process. However, the process for forming the first material layer 142 is not limited thereto.

The second mask layer 144 may be formed on the first material layer 142. The second mask layer 144 may include a metal, an alloy, a metallic carbide, a metallic nitride, a metallic oxynitride, a metallic oxycarbide, a semiconductor, polysilicon, an oxide, a nitride, an oxynitride, a hydrocarbon compound, or a combination thereof, but is not limited thereto. The second mask layer 144 may include a material having a sufficient etch selection ratio with the first material layer 142. For example, when the first material layer 142 includes an SOH material, the second mask layer 144 may include at least one of silicon oxynitride, silicon nitride, and silicon oxide.

The second material layer 152 may be formed on the second mask layer 144. The second material layer 152 may include a carbon-based material layer. For example, the second material layer 152 may include an ACL or an SOH material. The SOH material may include a hydrocarbon compound or its derivatives having a relatively high carbon content in the range of 85 to 99 weight % with respect to a total weight of the SOH material. However, examples of the present invention are not limited thereto.

The third mask layer 154 may be formed on the second material layer 152. The third mask layer 154 may include a metal, an alloy, a metallic carbide, a metallic nitride, a metallic oxynitride, a metallic oxycarbide, a semiconductor, polysilicon, an oxide, a nitride, an oxynitride, a hydrocarbon compound, or a combination thereof, but is not limited thereto. The third mask layer 154 may include a material having a sufficient etch selection ratio with the second material layer 152. For example, when the second material layer 152 includes an SOH material, the third mask layer 154 may include at least one of silicon oxynitride, silicon nitride, and silicon oxide.

A fourth mask layer 160 may be formed on the third mask layer 154. The fourth mask layer 160 may be a photoresist pattern formed by a photolithography process.

The fourth mask layer 160 may include a plurality of first patterns 160a each extending in a first direction (an X direction in FIG. 1A) and having a line shape, and a second pattern 160b connecting end portions of the plurality of first patterns 160a and disposed to surround the plurality of first patterns 160a. Here, the term "pattern" may refer to any individual segment or section of a layer that has been patterned, e.g., etched to selectively remove portions thereof, and may also be referred to as a "feature". Each of the plurality of first patterns 160a may have a first width W1 and may be spaced a first distance S1 from an adjacent first pattern 160a in a second direction (a Y direction in FIG. 1A). Generally, when a minimum feature size of a semiconductor device is 1F, the first width W1 may be about 3F and the first space Si may be about 5F. However, examples of the inventive concept are not limited thereto.

The second pattern 160b may be wider than the first pattern 160a. More specifically, the second pattern 160b may have a minimum width greater than the first width W1 of the first pattern 160a. For example, the second pattern 160b may have a width greater than about 5F. The second pattern 160b may surround the plurality of first patterns 160a and may constitute an edge portion of the fourth mask layer 160, and therefore structural stability of the fourth mask layer 160 may be improved.

As shown in FIG. 1B, the cell region CR includes a main pattern region MR which is a region on the substrate 110 in which the plurality of first patterns 160a are formed, and an edge region ER which is a region on the substrate 110 in which the second pattern 160b is formed. The edge region ER may be a region in which a pattern wider than that formed in the main pattern region MR is formed.

The second pattern 160b may include a line connecting portion 160LC. The plurality of first patterns 160a may each be divided in the X direction by the line connecting portion 160LC. The line connecting portion 160LC may be for forming a line connecting pattern LCP (refer to FIG. 13C) connecting end portions of a plurality of line patterns in a subsequent process. The line connecting portion 160LC may have a width W2 in the X direction. In examples, the width W2 may be wider than 5F. However, examples of the present invention are not limited thereto, and the width W2 may vary depending on a width of a common source line region which may be formed on the line connecting pattern LCP As shown in FIG. 1A as an example, the second pattern 160b may cover substantially the entire area of the peripheral circuit region PR on the substrate 110. The plurality of first patterns 160a may be disposed only in the cell region CR on the substrate 110, i.e., are not disposed on the substrate 110 in the peripheral circuit region PR.

Figure 2A:
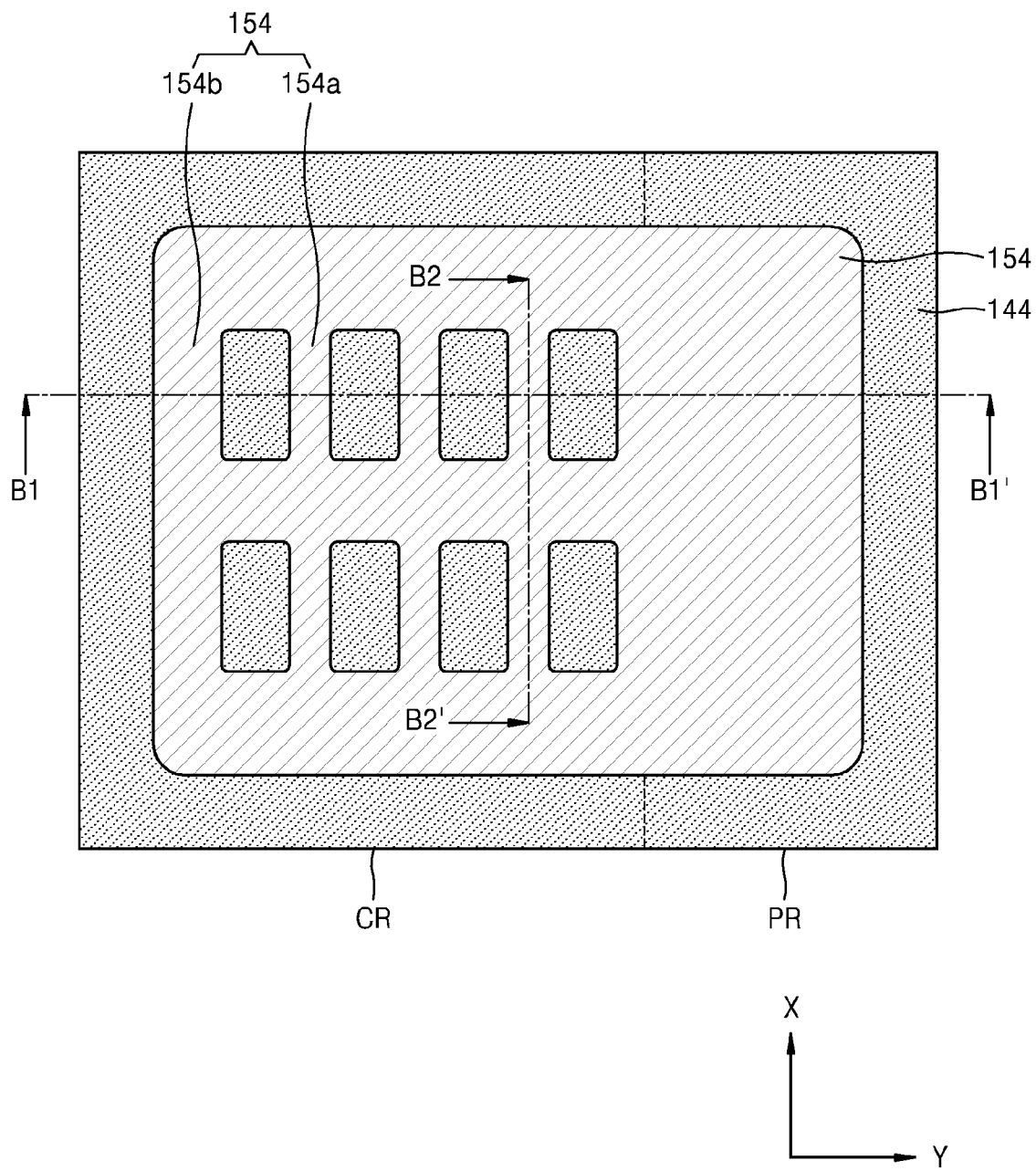

Referring to FIGS. 2A and 2B, the third mask layer 154 may be patterned using the fourth mask layer 160 as an etching mask, and then the second material layer 152 may be patterned using the third mask layer 154 as an etching mask.

In some examples, the patterning process of the third mask layer 154 and the second material layer 152 may be an anisotropic etching process.

As shown in FIG. 2B, the third mask layer 154 may include a first portion 154a disposed on the main pattern region MR and a second portion 154b disposed on the edge region ER, and each of the first portion 154a and the second portion 154b may have a portion and an arrangement corresponding to a location and an arrangement of the plurality of first patterns 160a and the second pattern 160b of the fourth mask layer 160. For example, a width of each line pattern in the first portion 154a of the third mask layer 154 may be similar to the first width W1 (refer to FIG. 1B) of the plurality of first patterns 160a of the fourth mask layer 160.

As shown in FIG. 2B, the first portion 154a of the third mask layer 154 on the main pattern region MR may include line patterns having a relatively small width, whereas the second portion 154b of the third mask layer 154 on the edge region ER may include line patterns having a relatively large width. Accordingly, a thickness t11 of the first portion 154a of the third mask layer 154 may be smaller than a thickness t21 of the second portion 154b due to a loading effect in the etching process of the third mask layer 154, or in the etching process of the second material layer 152 in which the third mask layer 154 is used as an etching mask.

In other examples, in a patterning process of the second material layer 152, the second material layer 152 may be etched until a top surface of the second mask layer 144 is exposed, and additionally the third mask layer 154 may be over-etched. In this case, a difference in thickness between the first portion 154a and the second portion 154b of the third mask layer 154 may be even more pronounced.

In examples, a difference between the thickness t11 of the first portion 154a and the thickness t21 of the second portion 154b may be properly compensated for by appropriately specifying a material or a thickness of a first spacer 162, a deposition condition and/or an etch condition of the first spacer 162 (formed in a subsequent process and as will be described with reference to FIG. 4B).

Figure 3A:
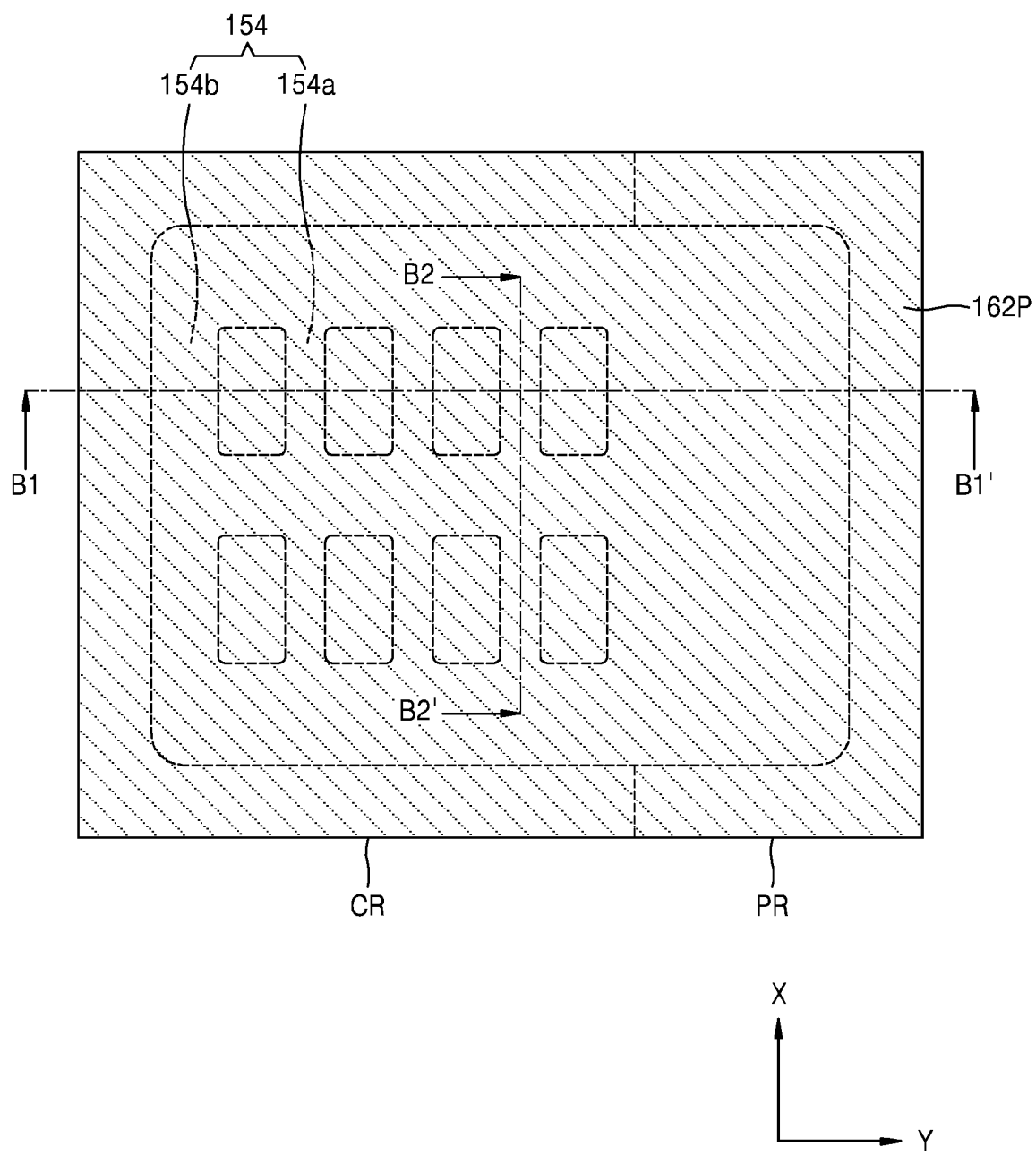
Figure 3B:
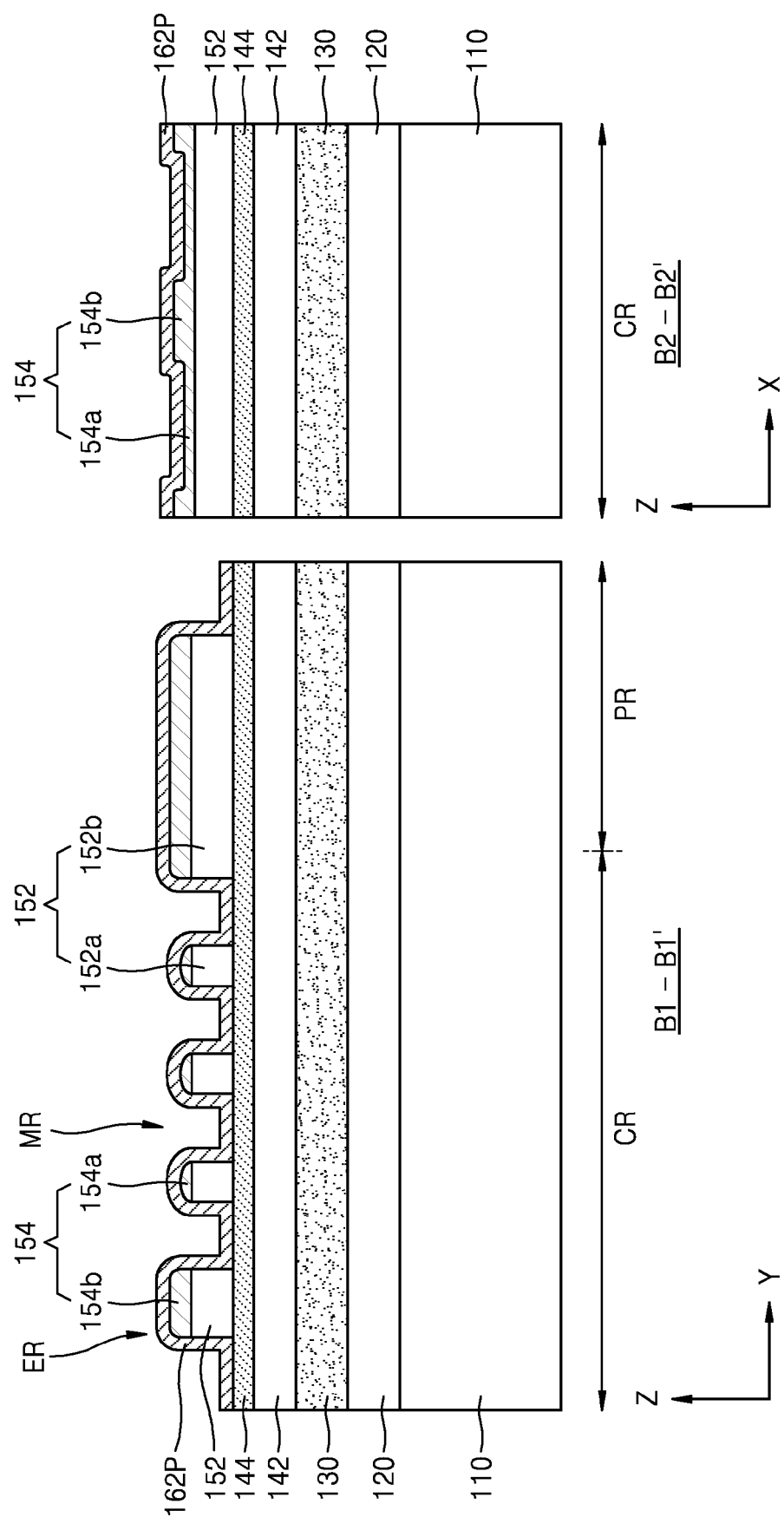

Referring to FIGS. 3A and 3B, a first preliminary spacer layer 162P may be formed on the second mask layer 144, the second material layer 152, and the third mask layer 154. The first preliminary spacer layer 162P may be conformally formed on an exposed top surface of the second mask layer 144, the first portion 154a and the second portion 154b of the third mask layer 154, and side surfaces of a first portion 152a and a second portion 152b of the second material layer 152.

In examples, the first preliminary spacer layer 162P may include at least one of silicon nitride, silicon oxide, and silicon oxynitride. The first preliminary spacer layer 162P may include a material having a sufficient etch selection ratio with the second material layer 152 or the second mask layer 144. In examples, the first preliminary spacer layer 162P may be formed to have a thickness of about 1F.

Figure 4A:
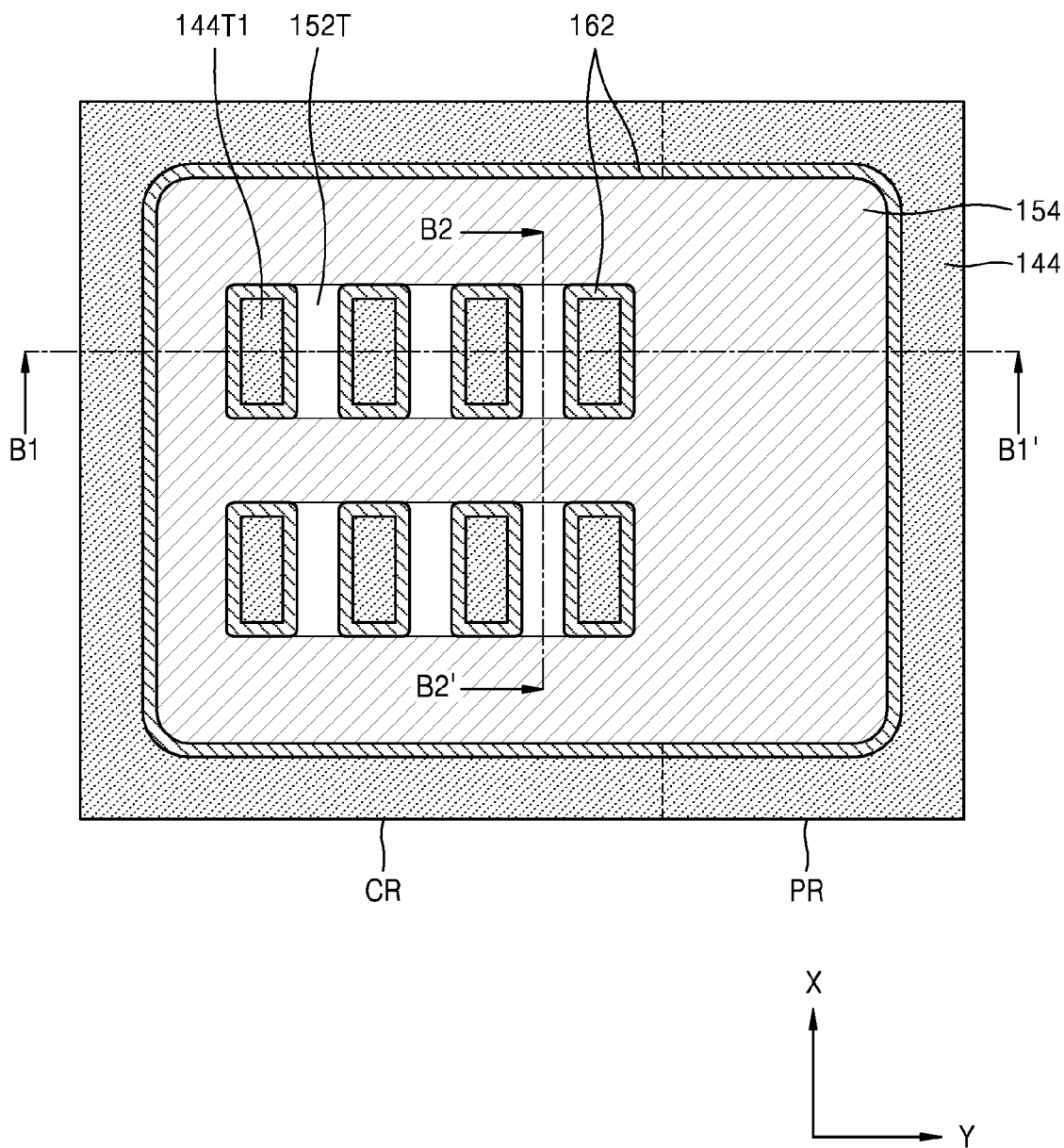
Figure 4B:
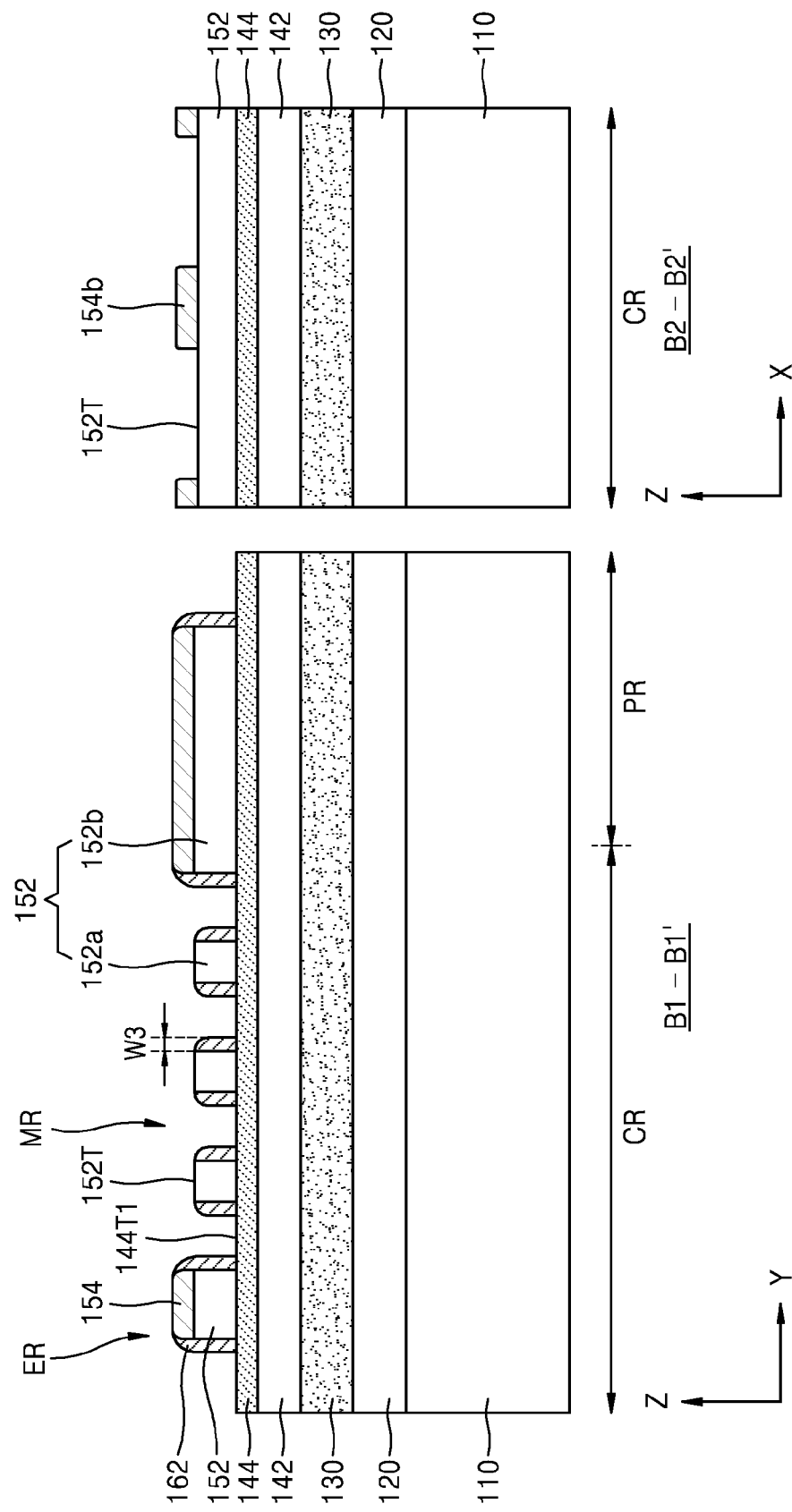

Referring to FIGS. 4A and 4B, the first spacer 162 may be formed on the side surfaces of the second material layer 152 by performing anisotropic etching on the first preliminary spacer layer 162P (refer to FIG. 3B). Here, a first top surface 144T1 of the second mask layer 144 covered by the first preliminary spacer layer 162P may be exposed.

In examples, the first spacer 162 may have a width W3, and the width W3 may be about 1F.

In examples, in a process of forming the first spacer 162, the first portion 154a (refer to FIG. 3B) of the third mask layer 154 may be removed, and only the second portion 154b of the third mask layer 154 may remain. More specifically, because the thickness t11 (refer to FIG. 3B) of the first portion 154a of the third mask layer 154 is smaller than the thickness t21 of the second portion 154b, in the anisotropic etching process, the first portion 154a of the third mask layer 154 may be also consumed, and a top surface 152T of the first portion 152a of the second material layer 152 may be exposed at a position at which the first portion 154a of the third mask layer 154 is removed. Meanwhile, the second portion 154b of the third mask layer 154 of the edge region ER has a relatively large thickness, and therefore may not be removed in the anisotropic etching process but may remain. Furthermore, in the peripheral circuit region PR, the second portion 154b of the third mask layer 154 may also remain. Therefore, a top surface of the second portion 152b of the second material layer 152 in the edge region ER and the peripheral circuit region PR may be covered by the third mask layer 154.

In another example, in the process of forming the first spacer 162, the first portion 154a and the second portion 154b of the third mask layer 154 may not be removed, and then a specified thickness of the first portion 154a and the second portion 154b of the third mask layer 154 may be removed by an additional stripping process or etching process until the top surface 152T of the first portion 152a of the second material layer 152 is exposed. Therefore, the first portion 154a of the third mask layer 154 may be removed, and only the second portion 154b of the third mask layer 154 may remain.

As shown in FIG. 4A as an example, the top surface 152T of the second material layer 152 may be disposed between (respective sides of) two adjacent first spacers 162. That is, the first portion 154a of the third mask layer 154 disposed between the sides of two adjacent first spacers 162 may be removed, and the top surface 152T of the second material layer 152 at a position corresponding to the removed portion may be exposed. Therefore, the exposed top surface 152T of the second material layer 152 may have a greater length than the exposed first top surface 144T1 of the second mask layer 144 in the X direction. For example, when the first spacer 162 has a width of about 1F, the length of the exposed top surface 152T of the second material layer 152 in the X direction may be greater than the length of the first top surface 144T1 of the second mask layer 144 in the X direction by about 2F.

Figure 5A:
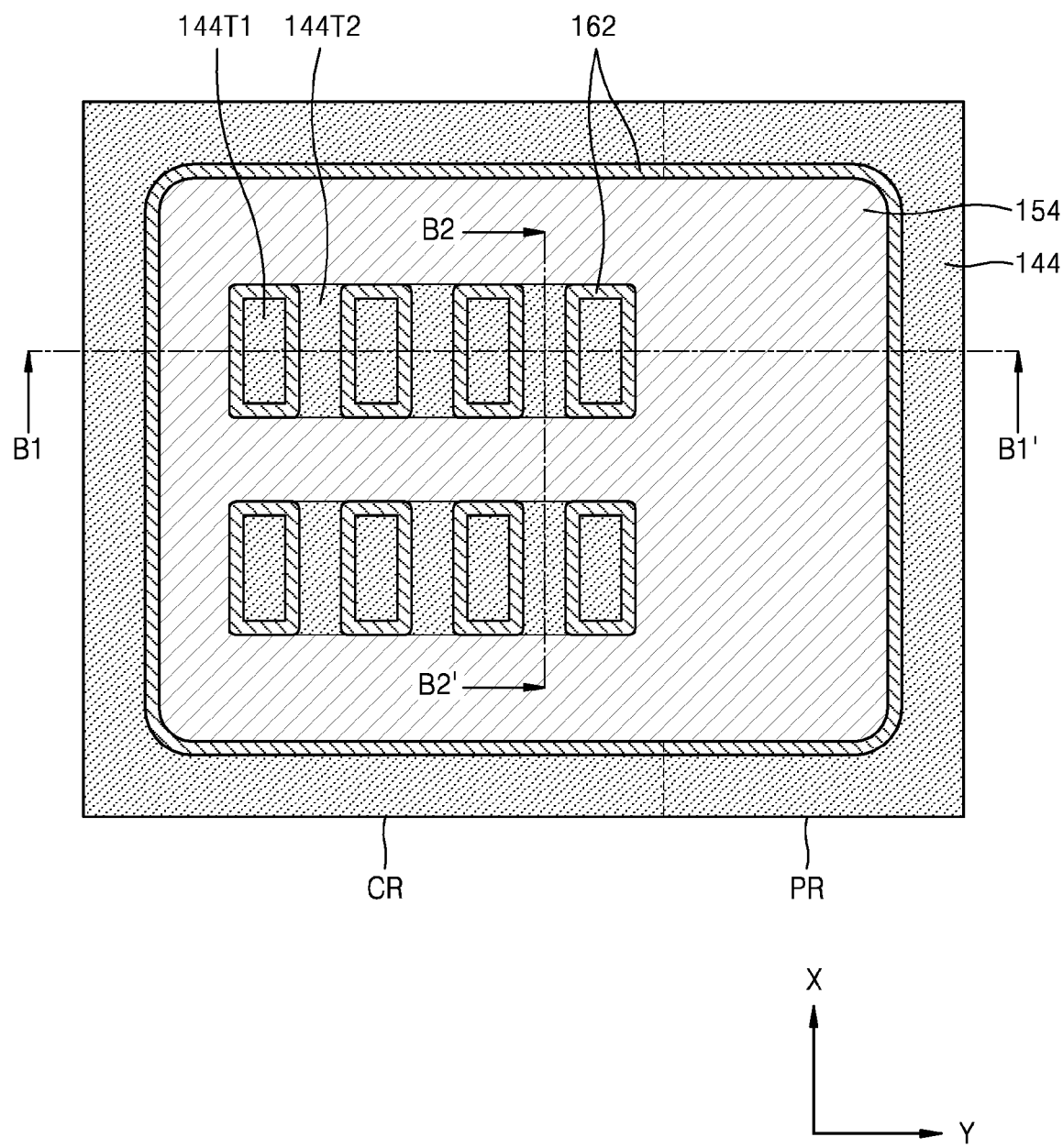
Figure 5B:
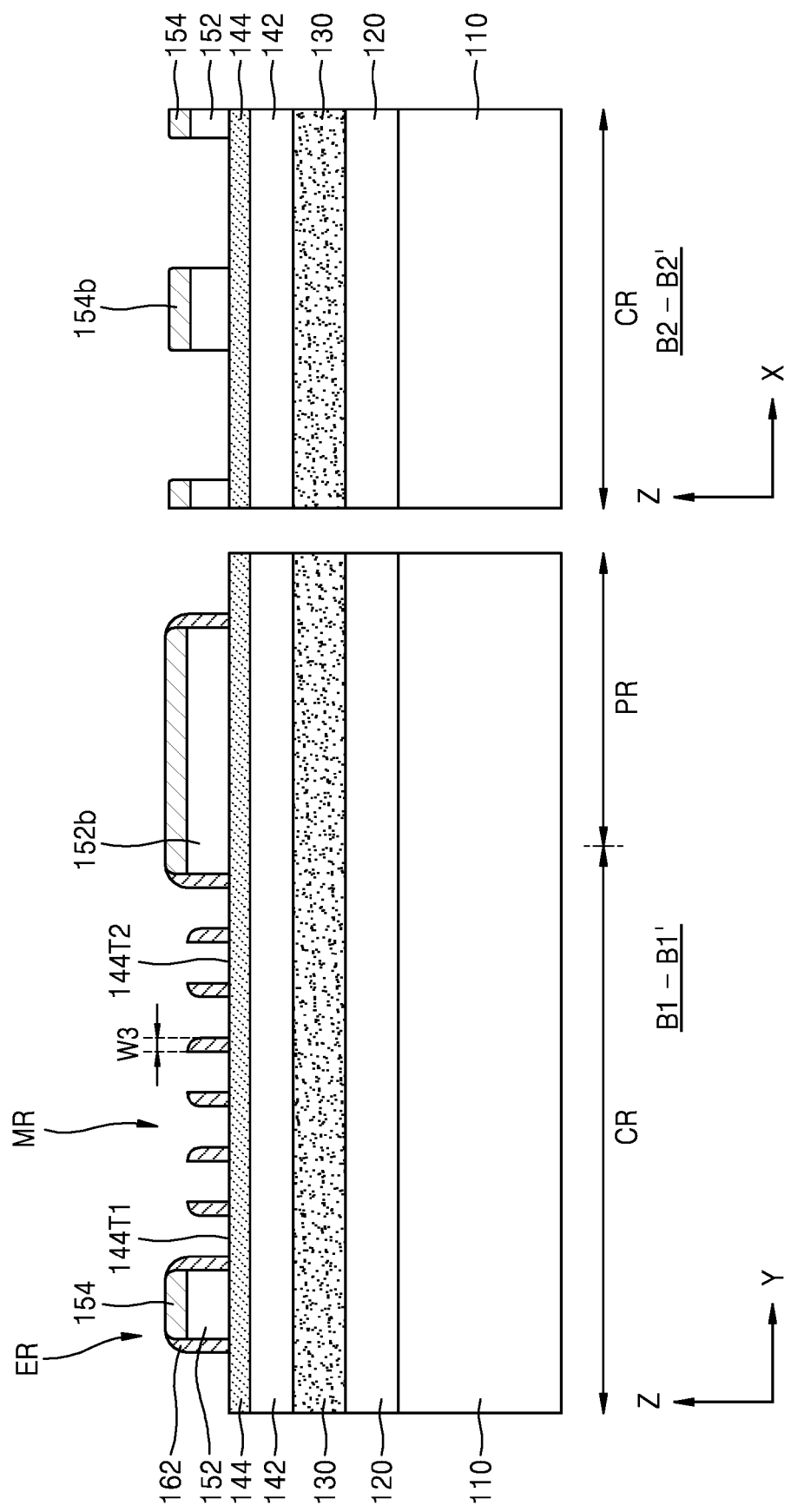

Referring to FIGS. 5A and 5B, the first portion 152a of the second material layer 152 may be removed, and the second top surface 144T2 of the second mask layer 144 may be exposed. Meanwhile, in the edge region ER, the second portion 152b of the second material layer 152 of which the top surface is covered by the second portion 154b of the third mask layer 154 may not be removed.

In examples, the second material layer 152 may be removed by an anisotropic etching process such as an ion-beam etching process, a reactive ion etching process, a plasma etching process, a high density plasma etching process, or the like. For example, the etching process may be a directional plasma process using nitrogen and hydrogen, but the inventive concept is not limited thereto.

In a removal process, the first spacer 162 may not be removed but may remain.

As shown in FIG. 5A as an example, the exposed top surface 152T (refer to FIG. 4A) of the second material layer 152 may have a greater length than the exposed first top surface 144T1 of the second mask layer 144 in the X direction, and therefore a top surface 144T2 of the second mask layer 144 exposed at a position at which the first portion 152a of the second material layer 152 is removed may have a greater length than the exposed first top surface 144T1 in the X direction. For example, when the first spacer 162 has a width of about 1F, the length of the exposed second top surface 144T2 in the X direction may be greater than the length of the first top surface 144T1 in the X direction by about 2F.

Figure 6A:
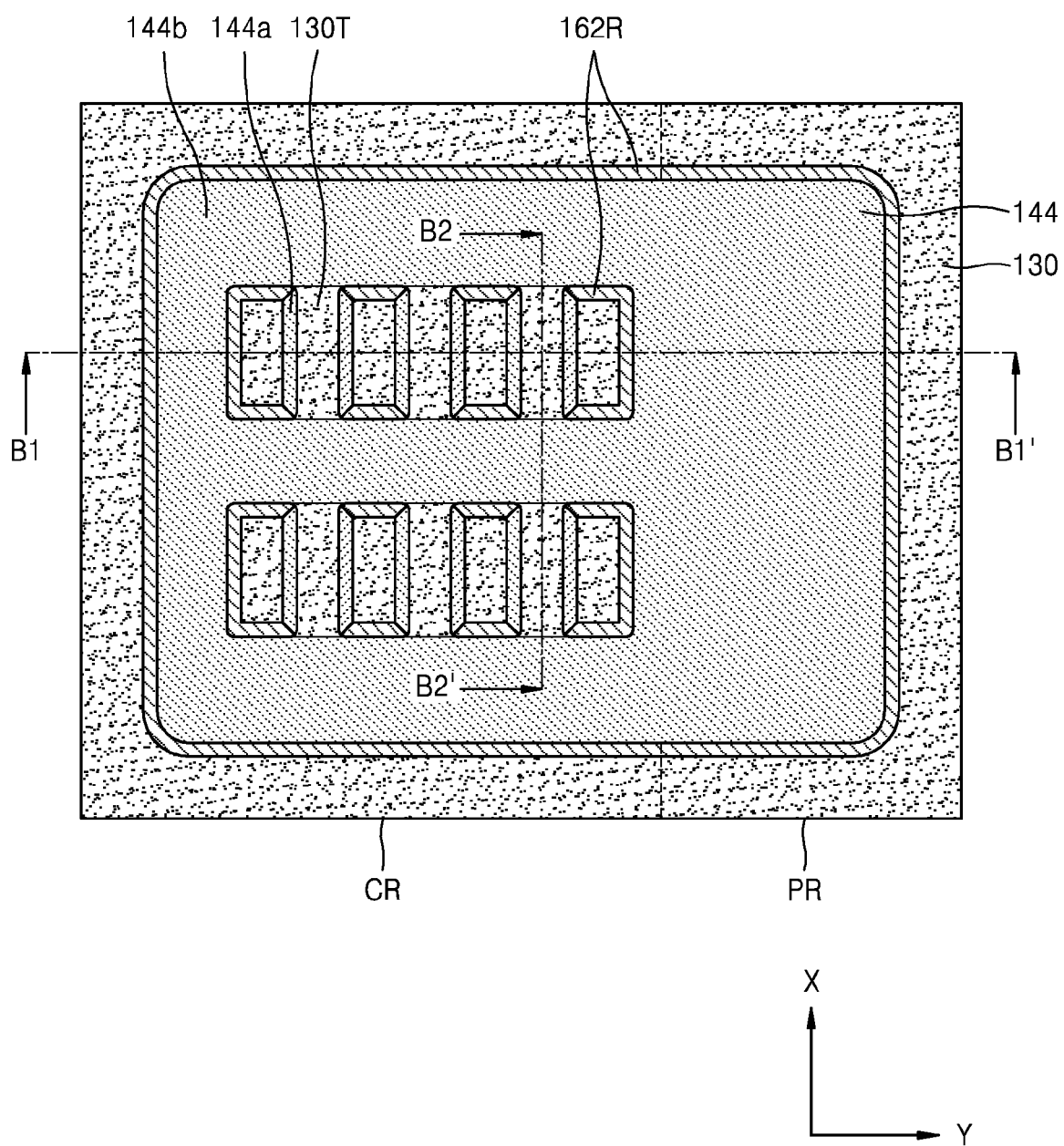
Figure 6B:
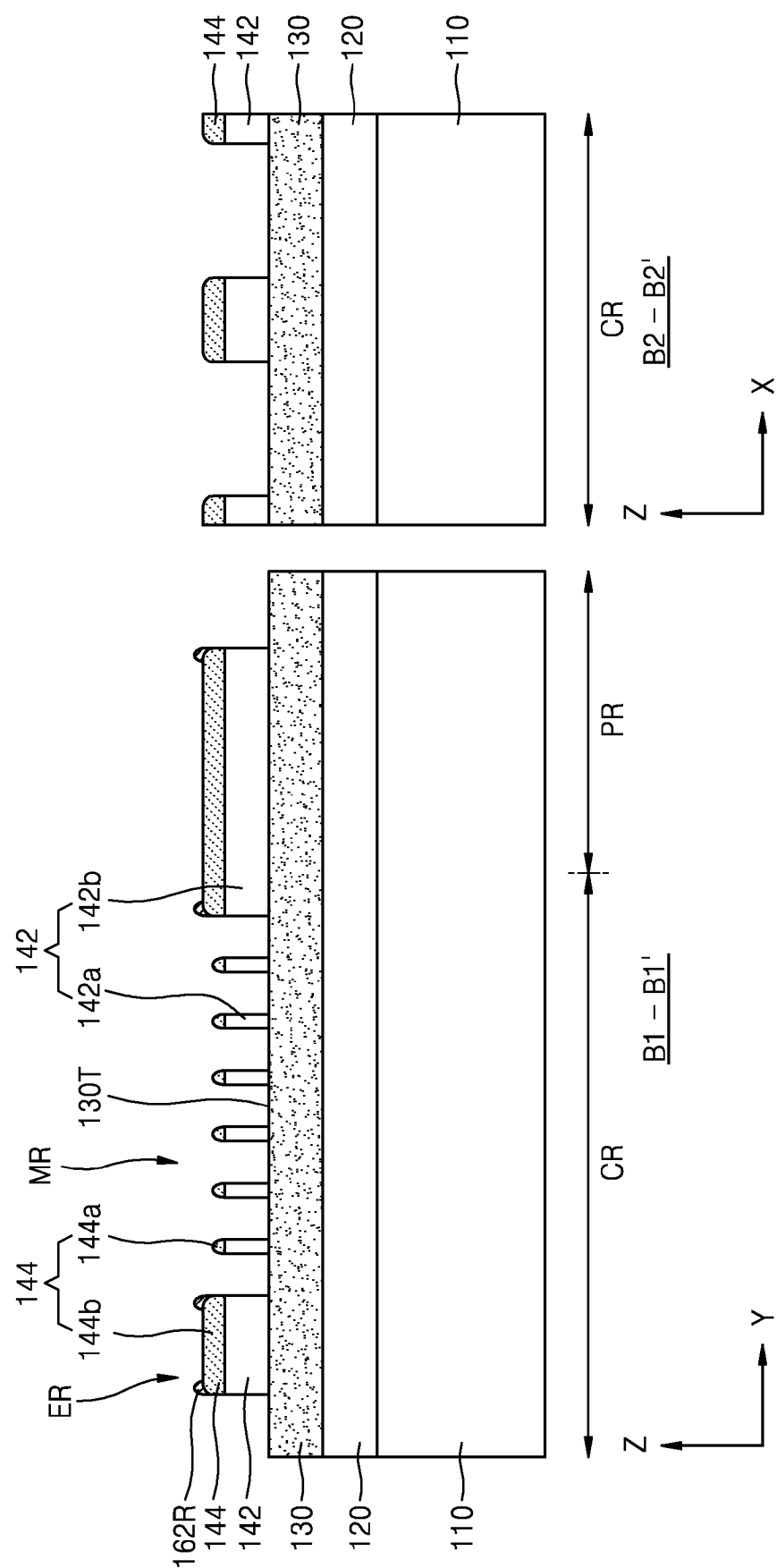

Referring to FIGS. 6A and 6B, the second mask layer 144 may be patterned using the third mask layer 154 (refer to FIG. 5B), the second portion 152b (refer to FIG. 5B) of the second material layer 152, and the first spacer 162 as an etching mask, and then the first material layer 142 may be patterned using the second mask layer 144 as an etching mask. Therefore, a top surface 130T of the first mask layer 130 may be exposed.

In examples, in the main pattern region MR, a relatively great amount of an upper portion of a first portion 144a of the second mask layer 144 may be consumed in the patterning process such that the remaining first portion 144a has a relatively small thickness, whereas in the edge region ER, less of an upper portion of a second portion 144b of the second mask layer 144 may be consumed such that the remaining second portion 144b has a relatively large thickness.

In examples, the first material layer 142 may be etched until the upper surface 130T of the first mask layer 130 is exposed, and then additionally the second mask layer 144 may be over-etched. In this case, the thickness difference between the first portion 144a and the second portion 144b of the second mask layer 144 may be even larger.

As shown in FIG. 6B, in the patterning process, a portion of the first spacer 162 is not etched and a first spacer remaining portion 162R may be formed on the second portion 144b of the second mask layer 144 of the edge region ER, but the inventive concept is not limited thereto.

Figure 7A:
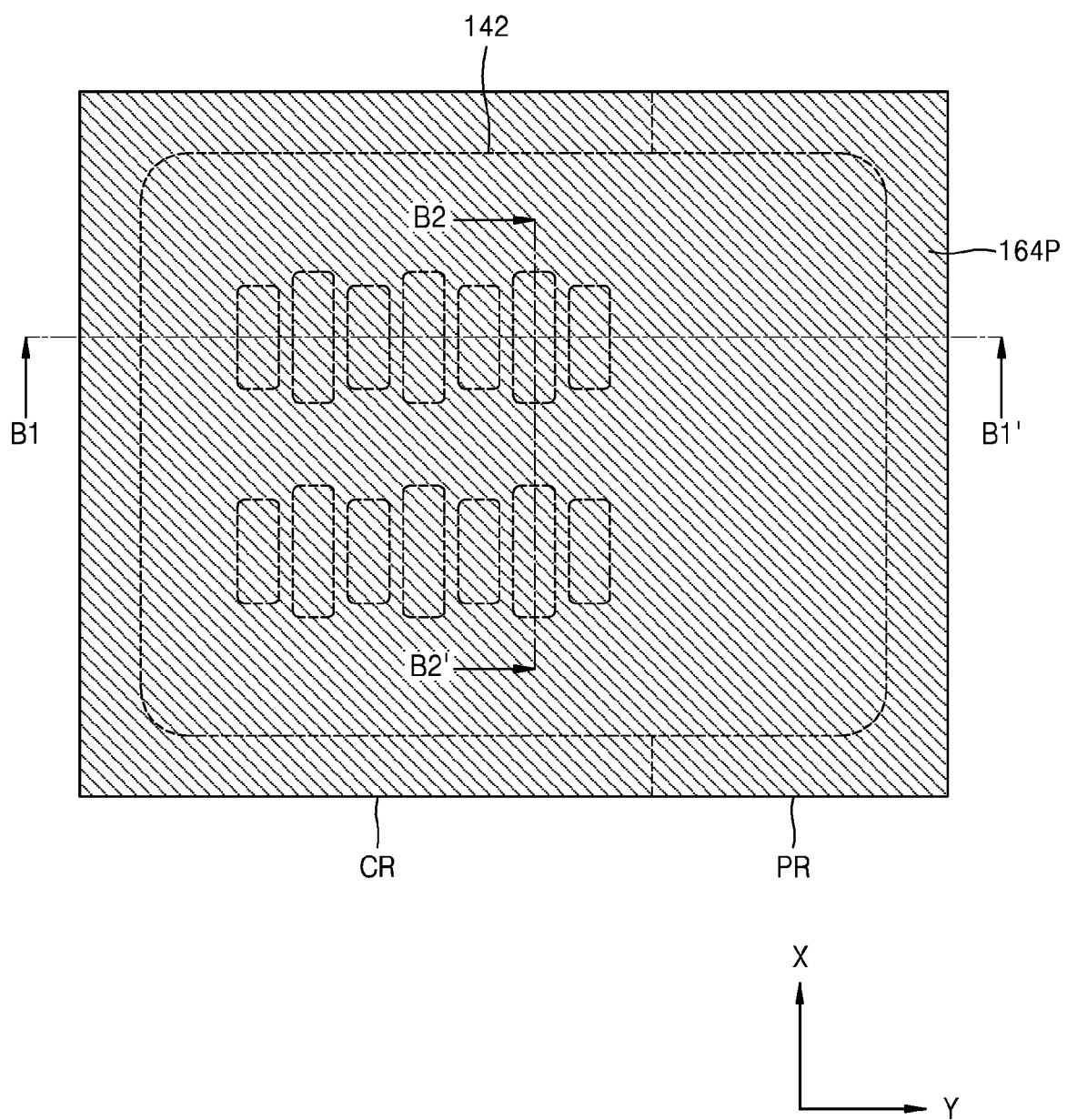
Figure 7B:
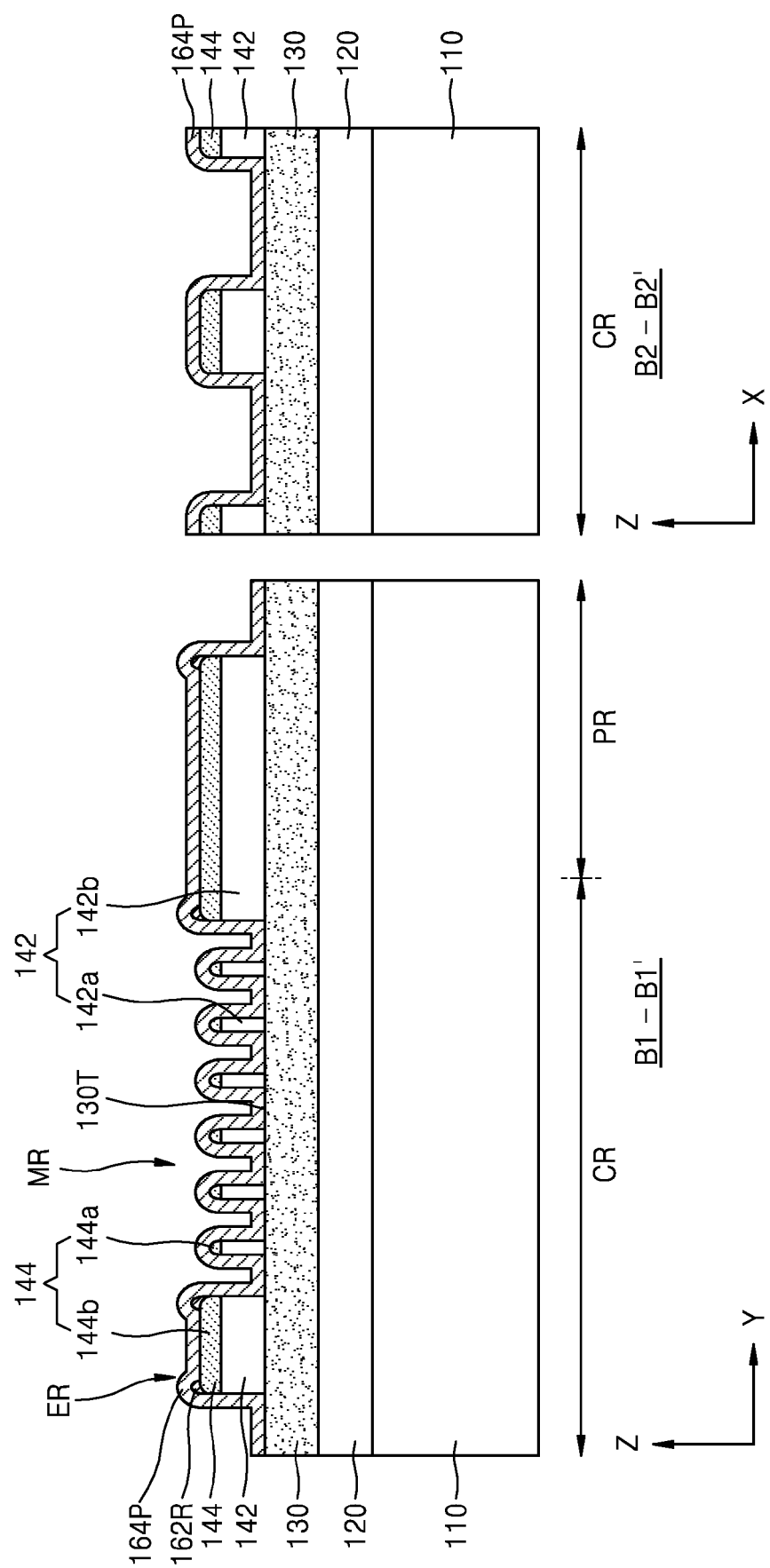

Referring to FIGS. 7A and 7B, a second preliminary spacer layer 164P may be formed on the first mask layer 130, the first material layer 142, and the second mask layer 144. The second preliminary spacer layer 164P may be conformally formed on the exposed top surface 130T (refer to FIG. 6B) of the first mask layer 130, the first portion 144a and the second portion 144b of the second mask layer 144, and side surfaces of a first portion 142a and a second portion 142b of the first material layer 142.

In examples, the second preliminary spacer layer 164P may include at least one of silicon nitride, silicon oxide, and silicon oxynitride. The second preliminary spacer layer 164P may include a material having a sufficient etch selection ratio with the first material layer 142 or the first mask layer 130. In examples, the second preliminary spacer layer 164P may be formed to have a thickness of about 1F.

Figure 8A:
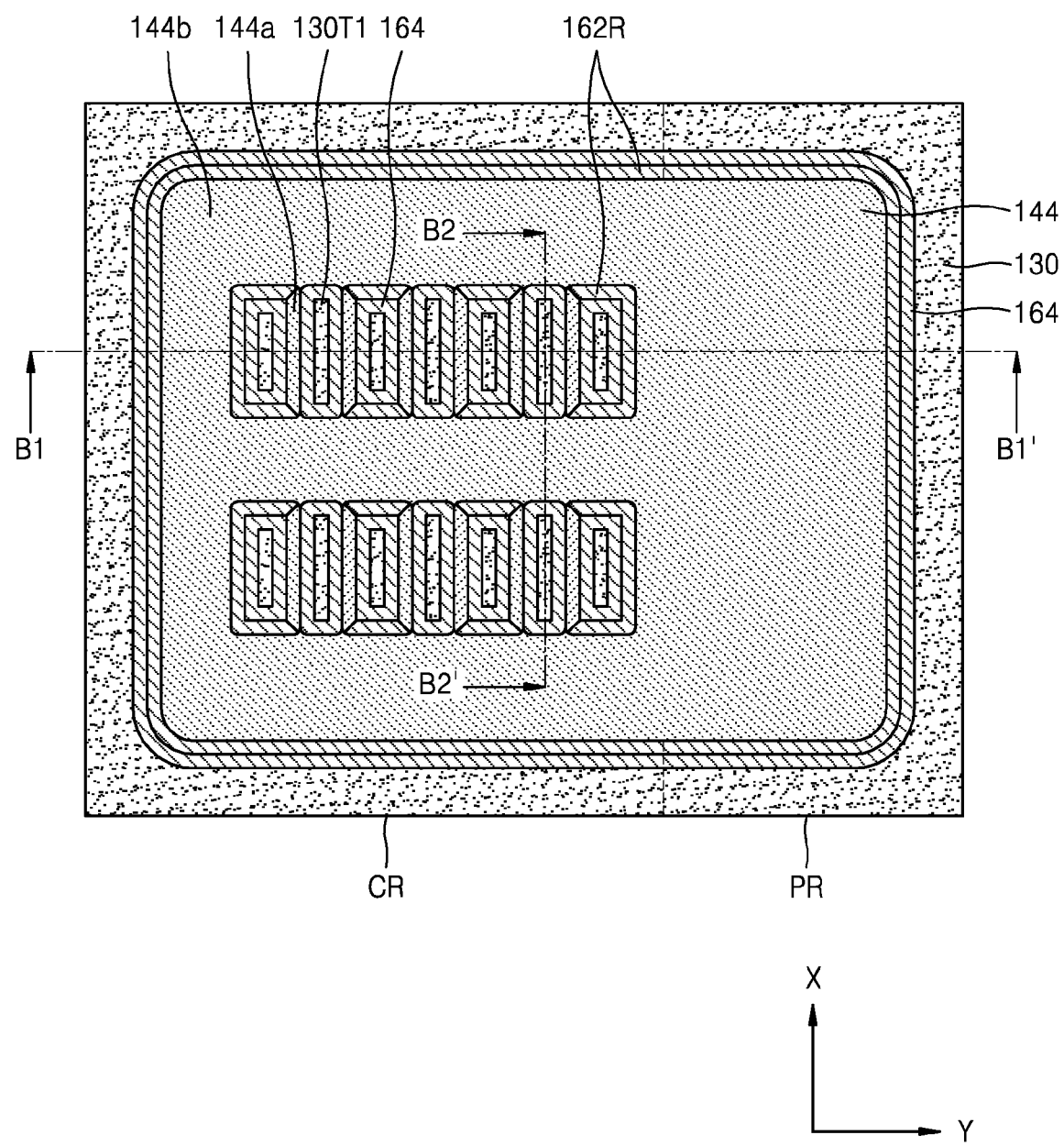
Figure 8B:
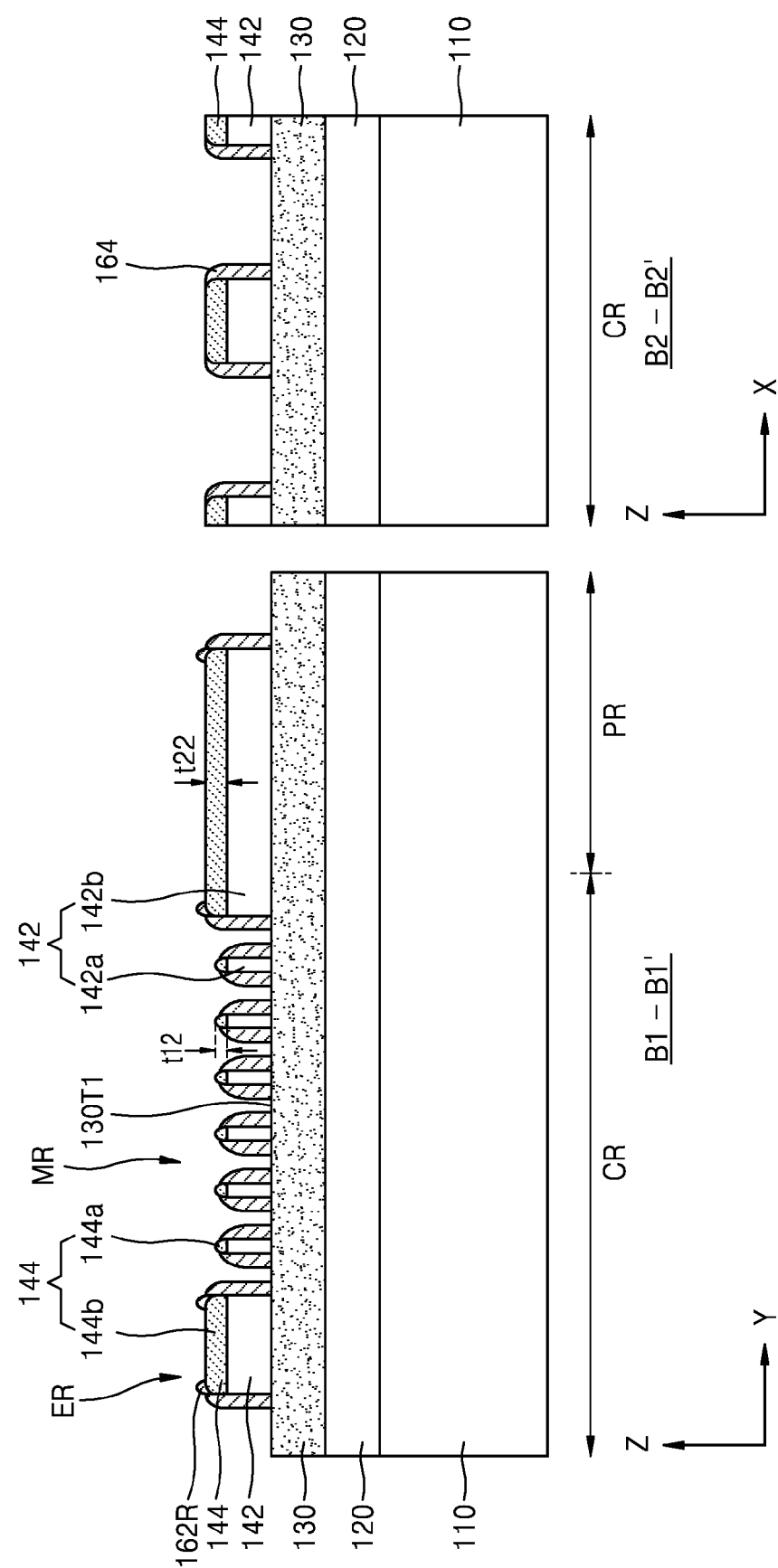

Referring to FIGS. 8A and 8B, a second spacer 164 may be formed on the sides of the first material layer 142 by performing anisotropic etching on the second preliminary spacer layer 164P (refer to FIG. 7B). Here, a first top surface 130T1 of the first mask layer 130 covered by the second preliminary spacer layer 164P may be exposed.

In examples, an upper portion of the second mask layer 144 may be partially consumed in a patterning process of the first material layer 142 and/or in a process for forming the second spacer 164, and may have a rounded side surface. Furthermore, similar to the process described with reference to FIGS. 4A and 4B in connection with the third mask layer 154, in an etching process, an etching amount of the first portion 144a of the second mask layer 144 may be greater than an etching amount of the second portion 144b. Therefore, a thickness t12 of the first portion 144a may be smaller than a thickness t22 of the second portion 144b.

In examples, a portion of the first spacer 162R may remain on the second portion 144b of the second mask layer 144. However, the inventive concept is not limited thereto.

Figure 9A:
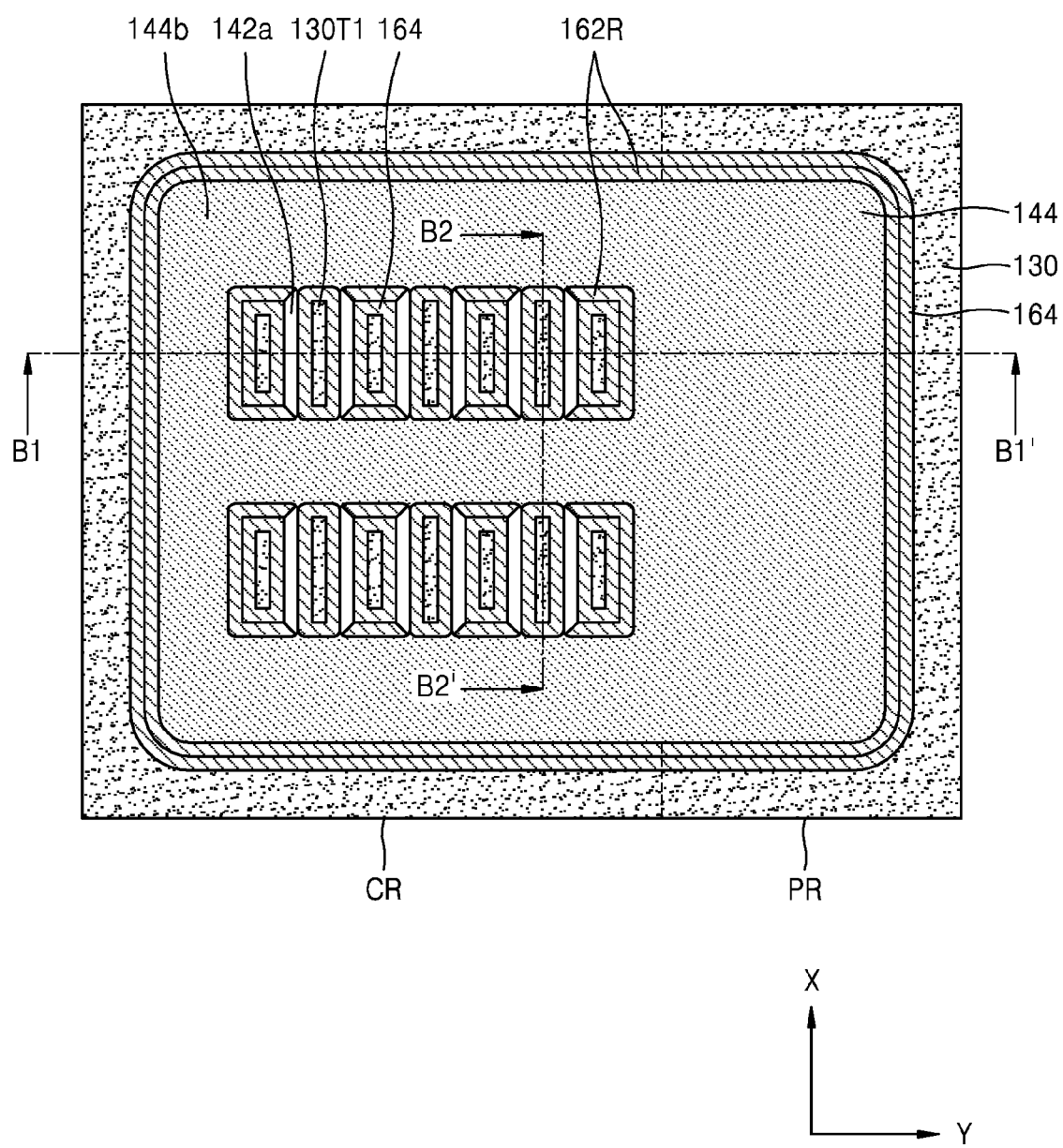

Referring to FIGS. 9A and 9B, the first portion 144a of the second mask layer 144 may be removed, and a first top surface 142T of the first portion 142a of the first material layer 142 may be exposed. Meanwhile, the second portion 144b of the second mask layer 144 on the edge region ER has a greater thickness than the first portion 144a, and therefore, in a removal process, only an upper portion of the second portion 144b may be removed and the thickness may be slightly reduced. Furthermore, in the peripheral circuit region PR, the second portion 144b of the second mask layer 144 is not removed but may remain. Therefore, an upper surface of the second portion 144b of the second mask layer 144 on the edge region ER and the peripheral circuit region PR may be covered by the second mask layer 144.

In examples, the removal process of the first portion 144a of the second mask layer 144 may be a stripping process or an etching process.

Figure 10A:
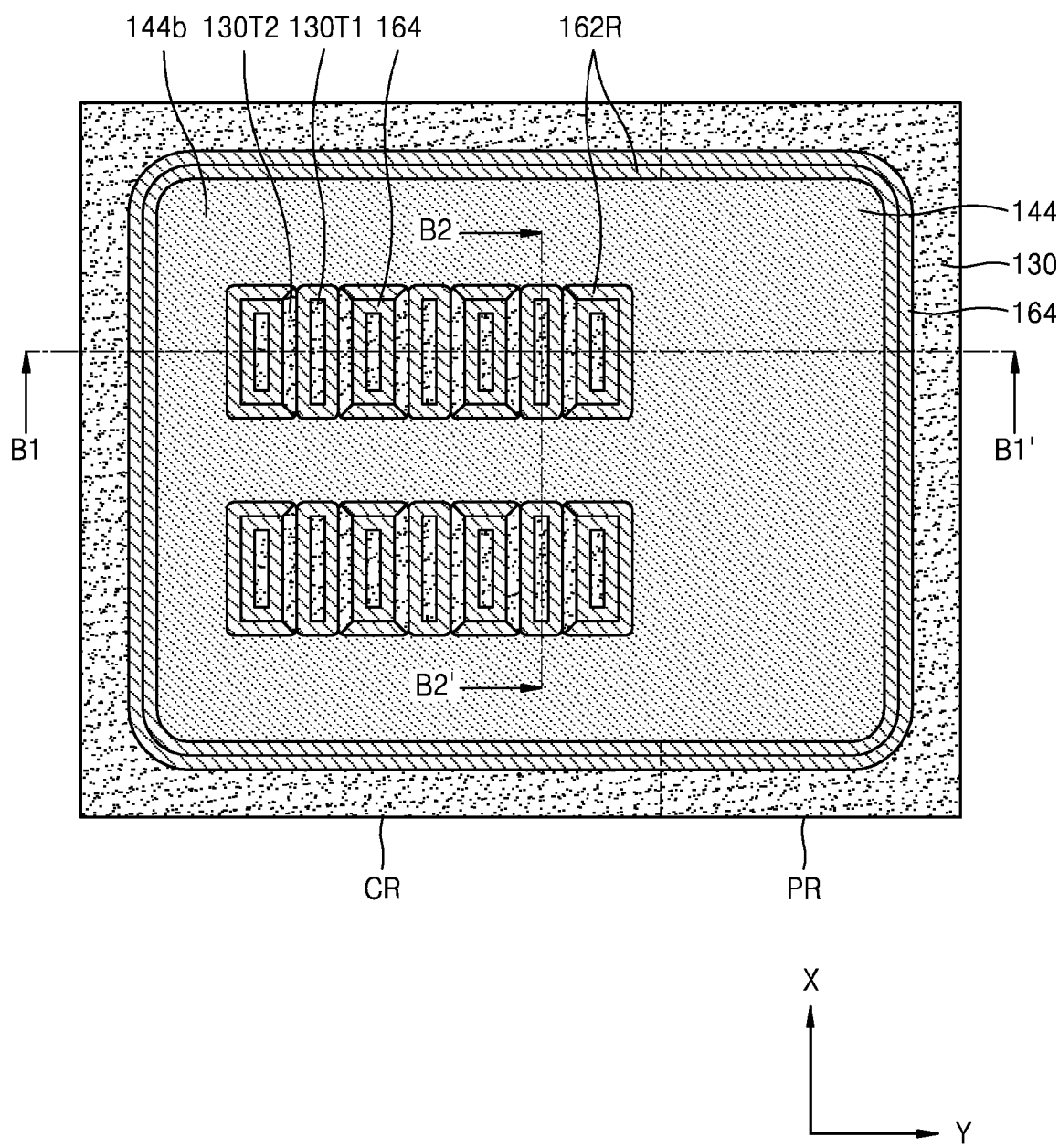
Figure 10B:
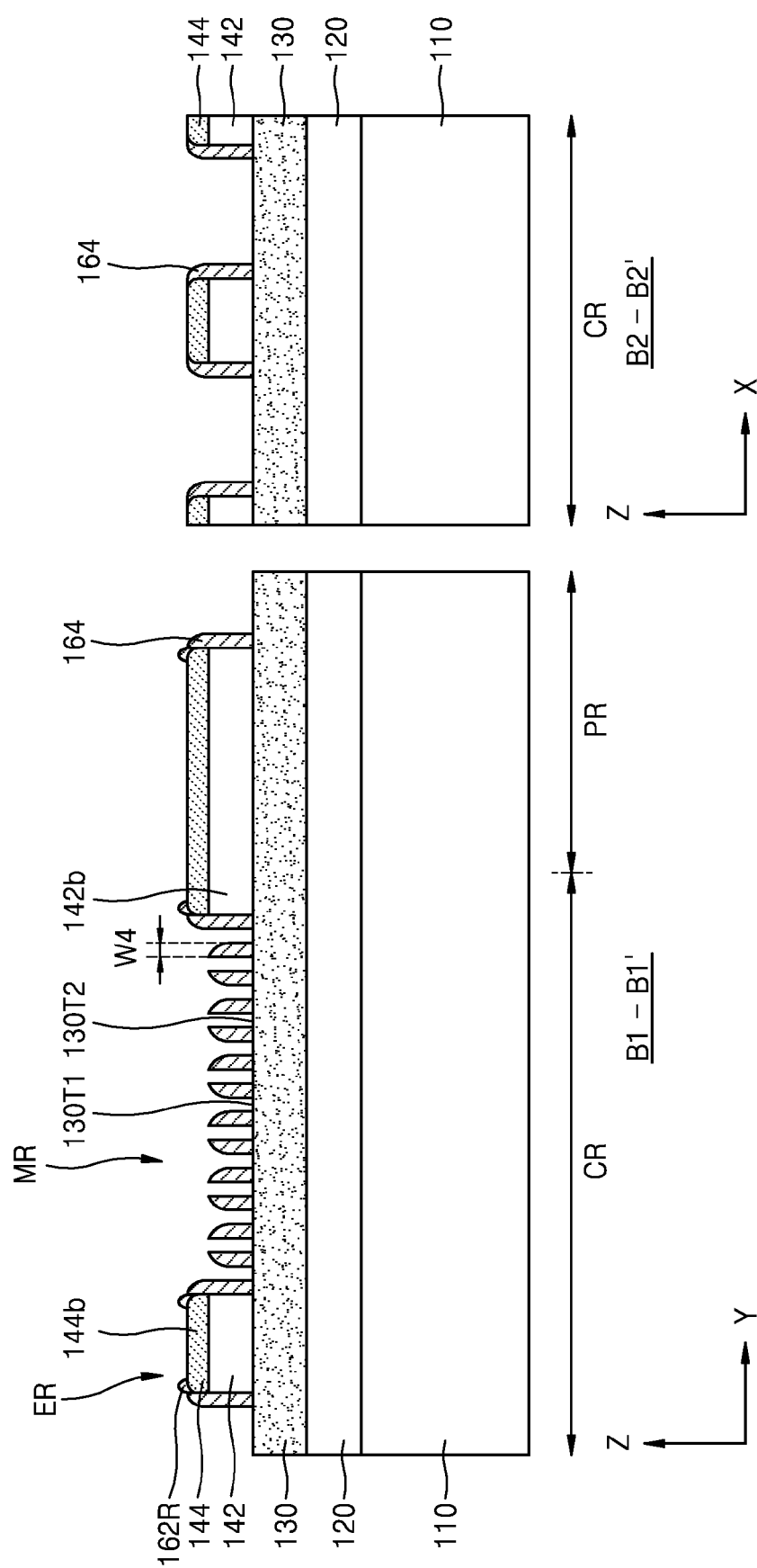

Referring to FIGS. 10A and 10B, the first portion 142a (refer to FIG. 9B) of the first material layer 142 may be removed. A second top surface 130T2 of the first mask layer 130 may be exposed at the location at which the first portion 142a of the first material layer 142 is removed. Meanwhile, a top surface of the second portion 142b of the first material layer 142 is covered by the second portion 144b of the second mask layer 144, and therefore the second portion 142b of the first material layer 142 is not removed in the removal process but may remain. Meanwhile, the peripheral circuit region PR is covered by the first material layer 142 and the second mask layer 144, and therefore a top surface of the first mask layer 130 may not be exposed in at least a portion of the peripheral circuit region PR.

In the removal process, the second spacer 164 is not removed but may remain. The second spacer 164 may have a width W4, and the width W4 may be about 1F. As shown in FIG. 10B, on the main pattern region MR, multiple ones of the second spacers 164 each with a width of about 1F may be arranged in the Y direction at a uniform spacing (substantially equal intervals) of about 1F. Furthermore, the first top surface 130T1 and the second top surface 130T2 of the first mask layer 130 may be alternately arranged in the Y direction, and the first top surface 130T1 and the second top surface 130T2 may each be disposed between two adjacent second spacers 164.

Figure 11A:
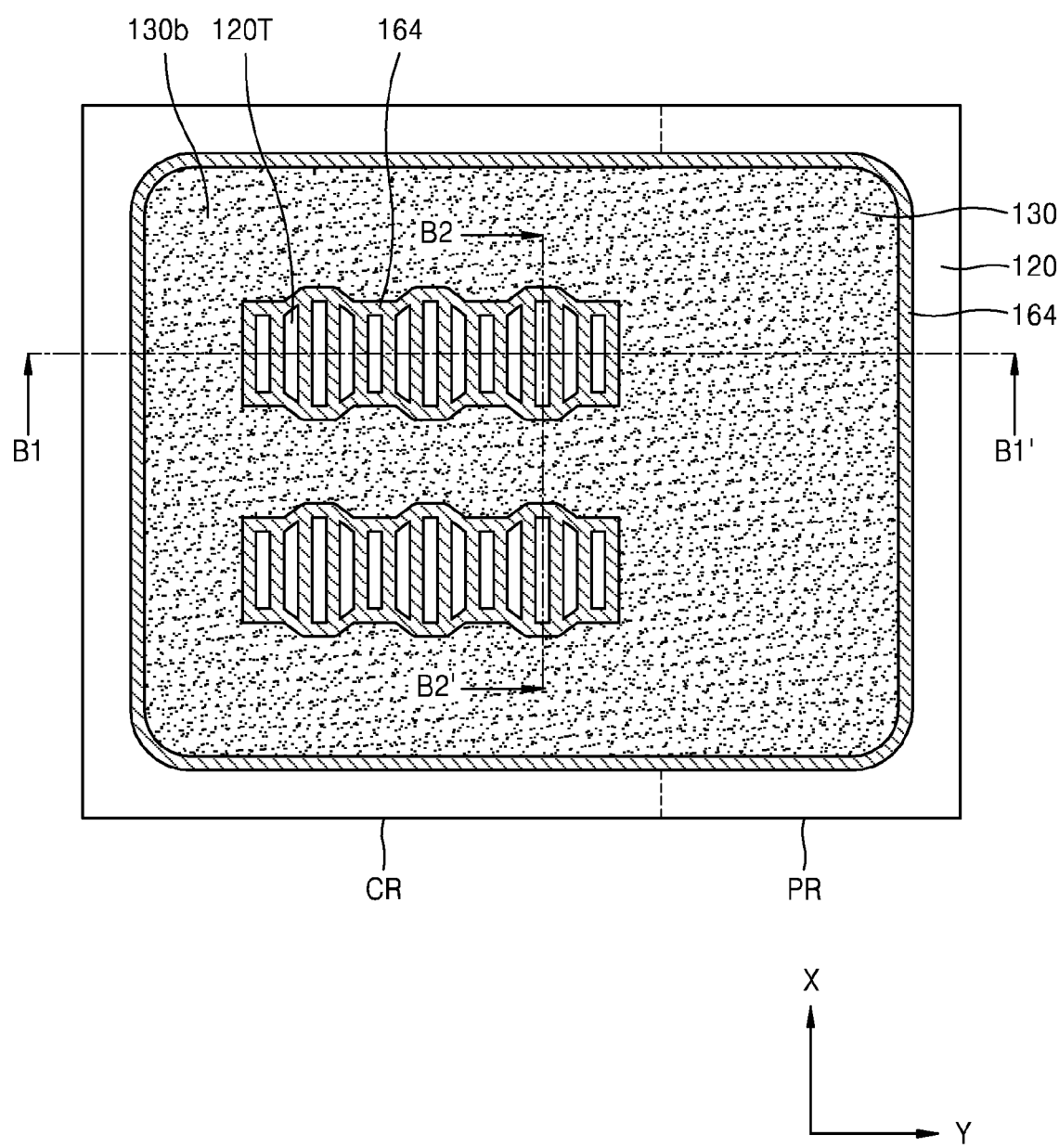
Figure 11B:
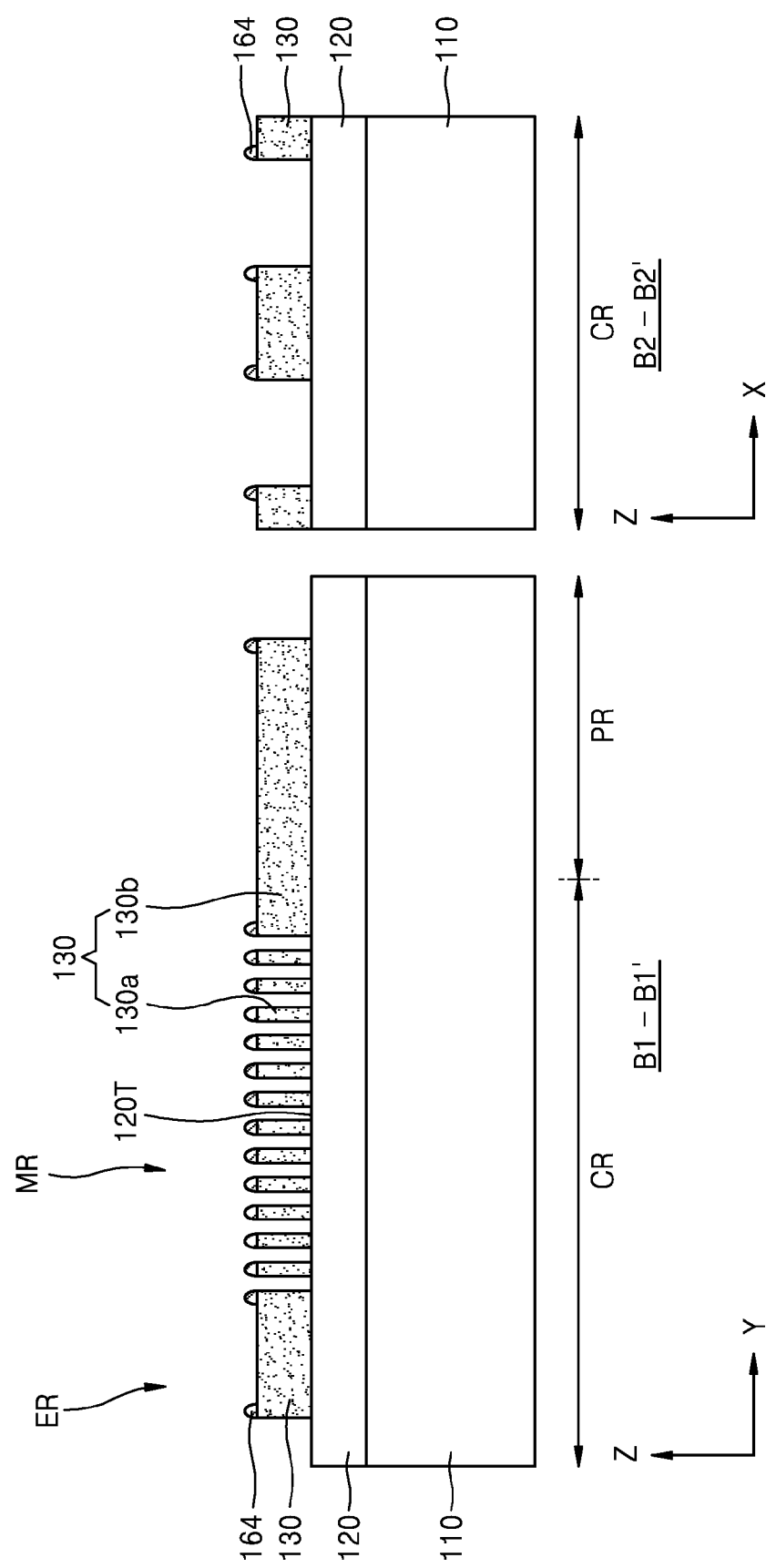

Referring to FIGS. 11A and 11B, the first mask layer 130 may be patterned using the second spacer 164 as an etching mask.

In a process of patterning the first mask layer 130, in the edge region ER, the second portion 142b (refer to FIG. 10B) of the first material layer 142 and the second portion 144b (refer to FIG. 10B) of the second mask layer 144 may be etched and removed. Therefore, in the edge region ER, a second portion 130B of the first mask layer 130 is not removed but may remain.

In the process of etching the first mask layer 130, an upper portion of the second spacer 164 may be removed, and a thickness of the second spacer 164 may be reduced.

Figure 12A:
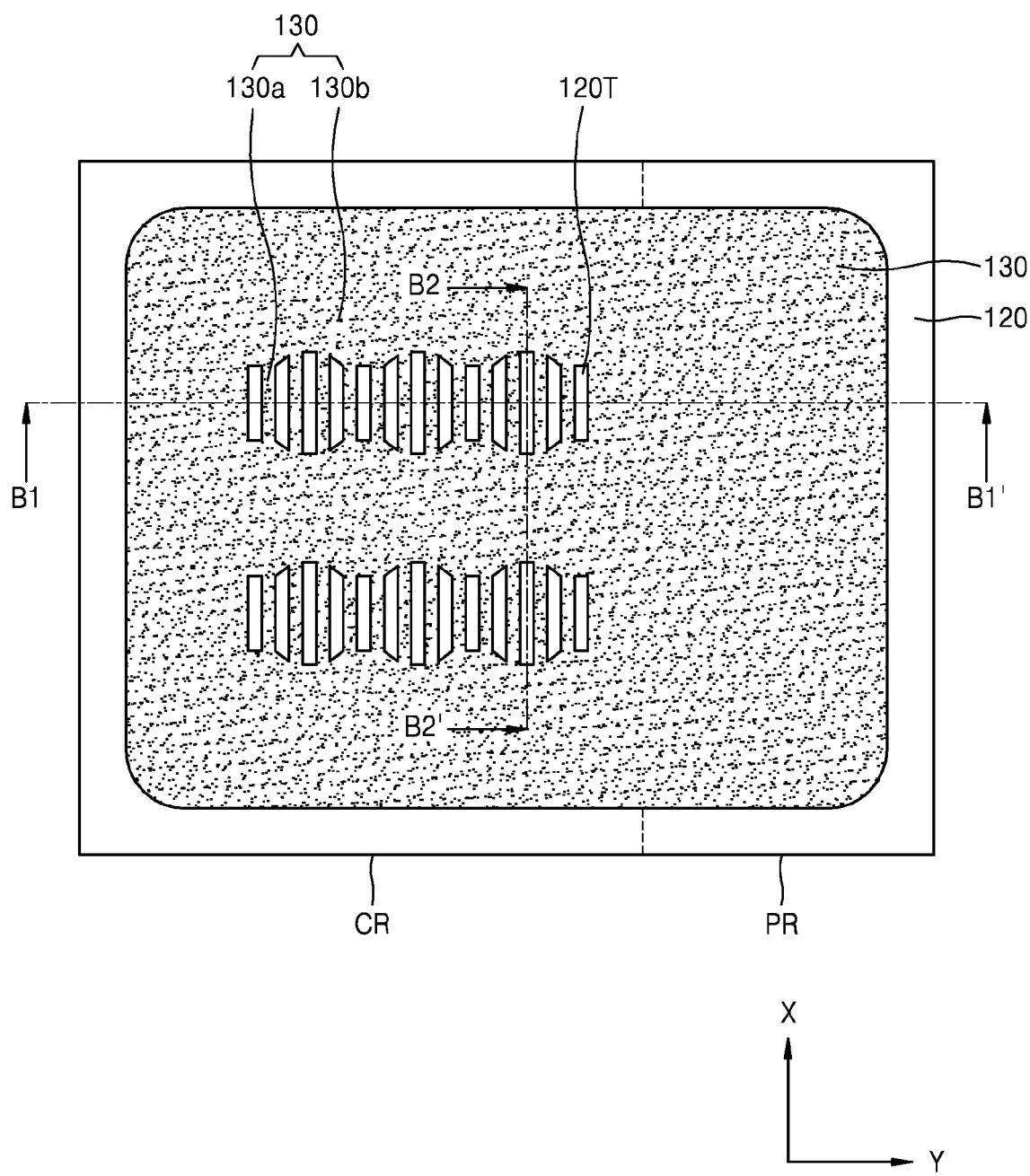

Referring to FIGS. 12A and 12B, the second spacer 164 may be removed.

In the main pattern region MR, features of a first portion 130a of the first mask layer 130 each with a width of about 1F may be repeatedly arranged in the Y direction at a spacing of about 1F, and in the edge region ER and the peripheral circuit region PR, the second portion 130b of the first mask layer 130 may be formed with a relatively large width. The second portion 130b of the first mask layer 130 may be disposed over substantially an entire area of the peripheral circuit region PR.

Figure 13A:
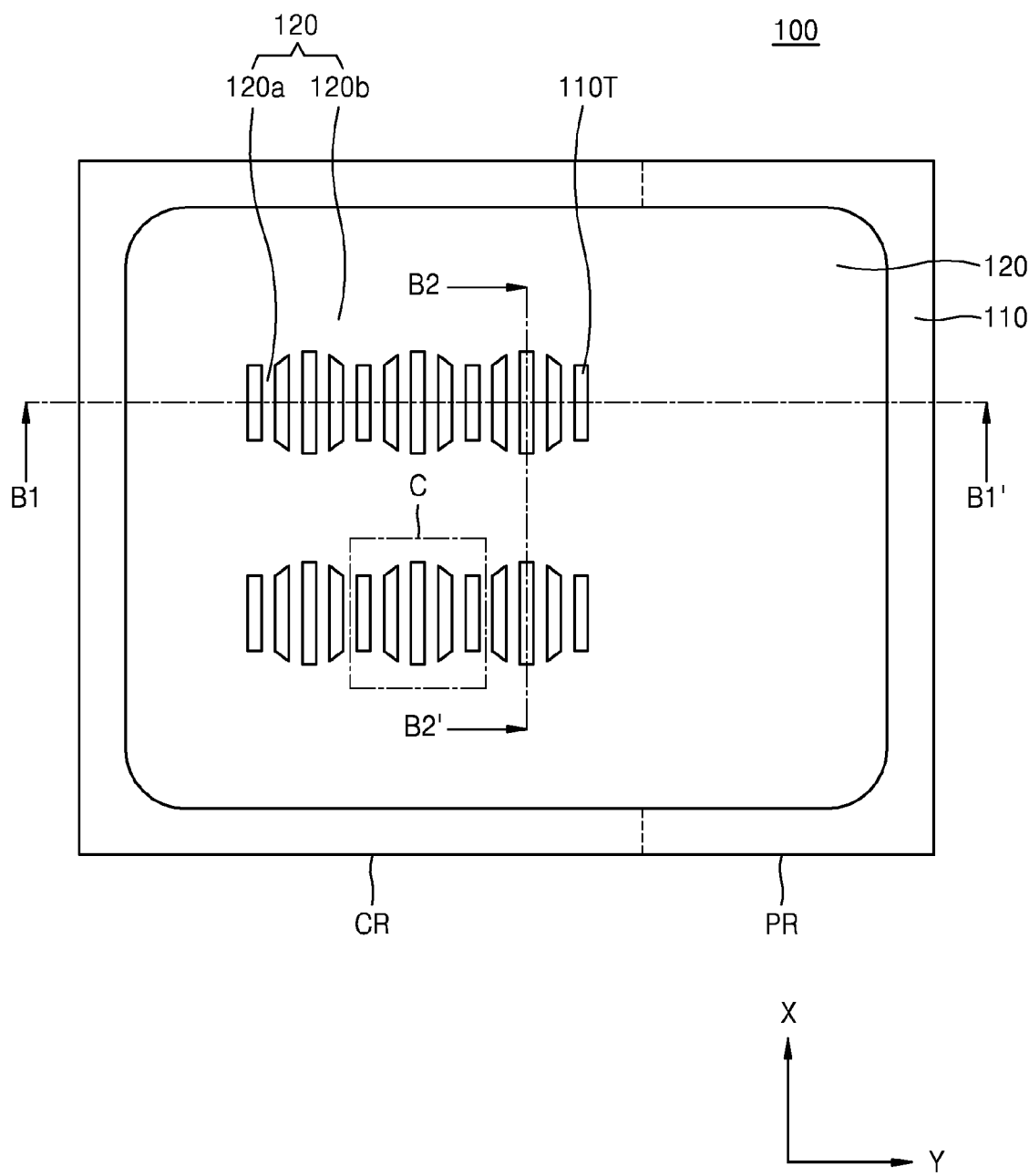
Figure 13B:
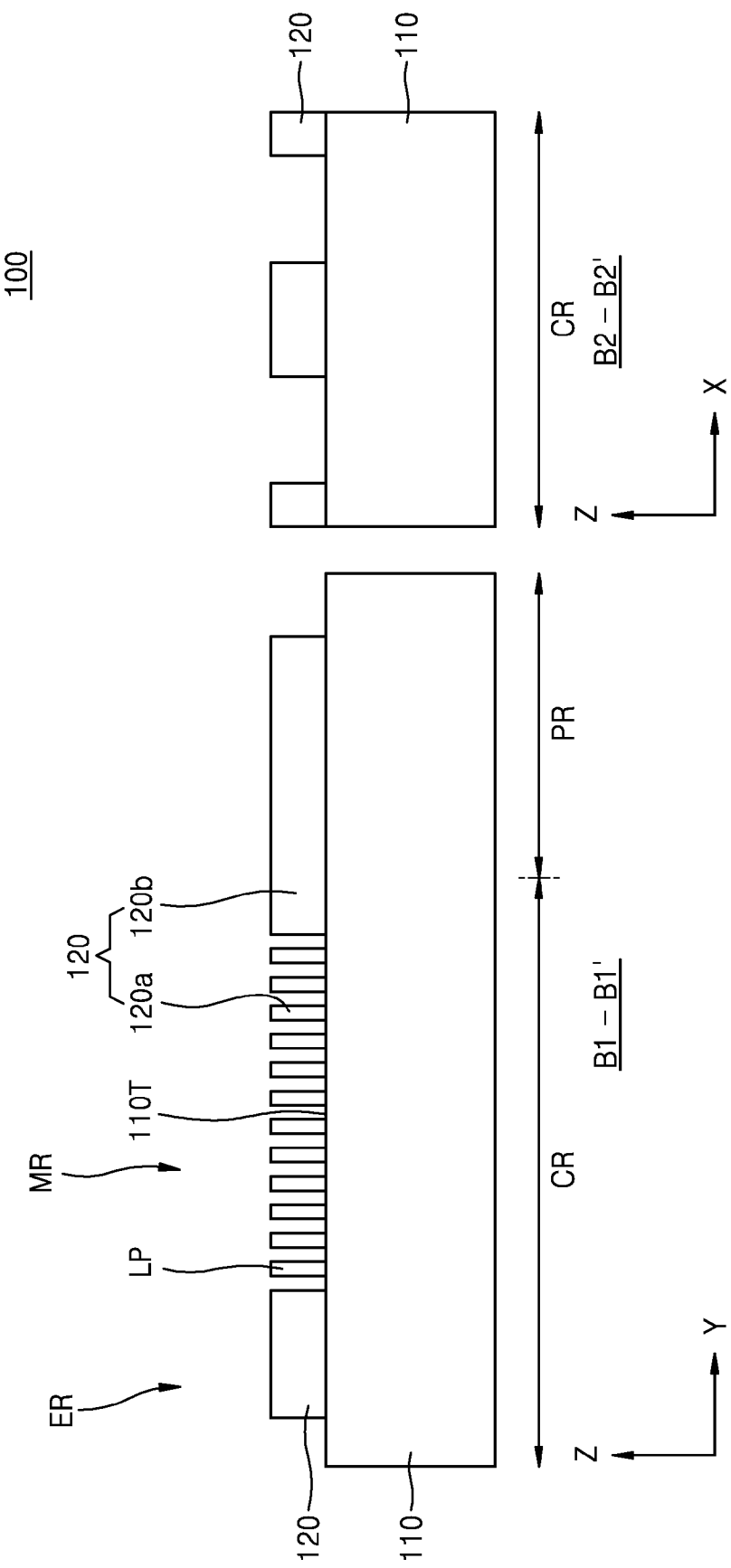
Figure 13C:
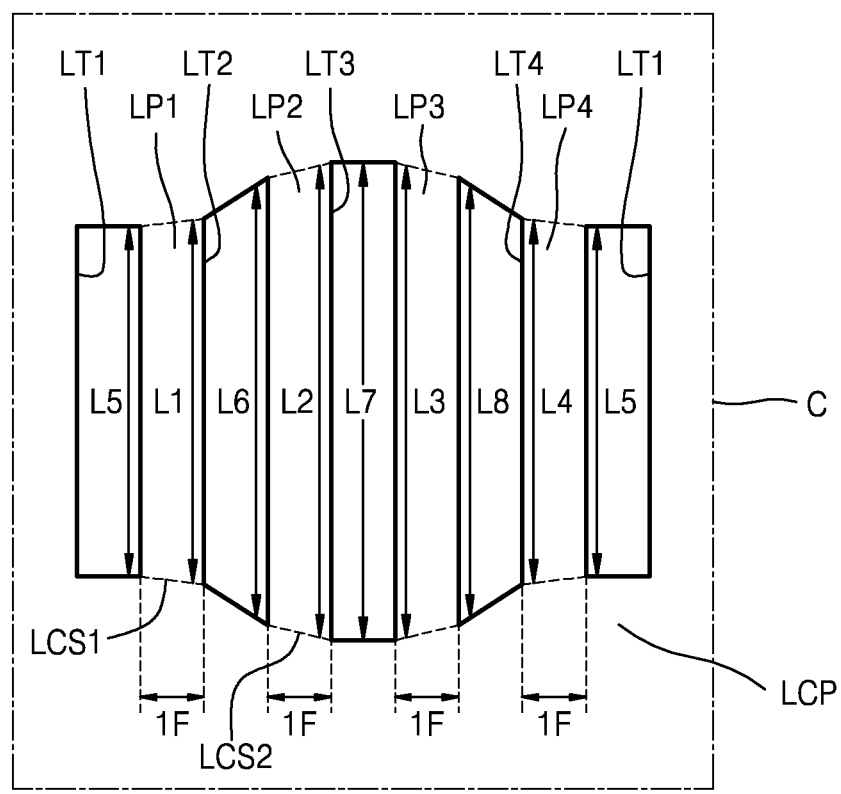

Referring to FIGS. 13A and 13C, the target layer 120 may be patterned using the first mask layer 130 as an etching mask. The target layer 120 may include a first portion 120a on the main pattern region MR and a second portion 120b on the edge region ER and the peripheral circuit region PR.

The first portion 120a may include line patterns LP each having a width of about 1F and repeatedly arranged in the Y direction at a uniform spacing (substantially equal intervals) of about 1F, and the second portion 120b may surround the plurality of line patterns LP.

Furthermore, the line patterns LP may be each divided in the X direction by the line connecting pattern LCP, i.e., may be discontinuous in the X direction. That is, the line connecting pattern LCP may be interposed between respective segments of each line pattern LP aligned in the X direction. Or described another way, the first portion 120a may include two groups of line patterns LP. In each of the groups, each line pattern LP has a width of about 1F and the line patterns LP of the set are repeatedly arranged in the Y direction at a uniform spacing (substantially equal intervals) of about 1F, and the second portion 120b may surround the groups of line patterns LP. Furthermore, the respective groups of line patterns LP may be separated from each other in the X direction by the line connecting pattern LCP. That is, the line connecting pattern LCP may be interposed in the X direction between two groups each comprising a plurality of the line patterns LP.

Hereinafter, shapes and arrangements of the line patterns LP and the line connecting pattern LCP will be described in detail.

As shown in FIG. 13C as an example, each of the line sets constituting a plurality of line patterns may include (and in this example, consist) of four line patterns LP consecutively disposed in the Y direction. These four line patterns LP will be referred to as first to fourth line patterns LP1, LP2, LP3 and LP4, respectively, for purposes of description. Furthermore, first to fourth trenches LT1, LT2, LT3 and LT4 consecutively disposed with respect to each other in the Y direction are each defined by and between two adjacent ones of the line patterns LP. For example, the second trench LT2 may be defined between a first line pattern LP1 and a second line pattern LP2 of one of the line sets, the third trench LT3 may be defined between the second line pattern LP2 and the third line pattern LP3 of the line set, the fourth trench LT4 may be defined between the third line pattern LP3 and the fourth line pattern LP4 of the line set, and the first trench LT1 may be defined between the fourth line pattern LP4 of the line set and the first line pattern LP1 of the adjacent line set.

In examples, the first to fourth line patterns LP1, LP2, LP3 and LP4 may respectively have lengths L1, L2, L3 and L4, respectively, in the X direction. Here the "lengths" may refer to the lengths of corresponding ones of the sides, e.g., the longest sides of the of the line patterns as shown in FIG. 13C which in this example are all straight and are closest to a center line extending in the X direction through the center of the set of line patterns LP1, LP2, LP3 and LP4. Or, the "length" of a line pattern LP may refer to the average of the lengths of the two straight sides of the line pattern LP. In any case, the length L2 of the second line pattern LP2 may be greater than the length L1 of the first line pattern LP1, the length L3 of the third line pattern LP3 may be greater than the length L1 of the first line pattern LP1, and the length L4 of the fourth line pattern LP4 may be smaller than the length L3 of the third line pattern LP3. In examples, the length L2 of the second line pattern LP2 may be substantially the same as the length L3 of the third line pattern LP3, and the length L1 of the first line pattern LP1 may be substantially the same as the length L4 of the fourth line pattern LP4. Here, and throughout the disclosure, the term "substantially" may mean exactly or may encompass slight and insignificant variations that are the inherent result of a fabrication process, i.e., which are within the tolerances of the fabrication process.

Also, the length of each set of line patterns LP1, LP2, LP3 and LP4 may be the length of the longest one of the line patterns LP1, LP2, LP3 and LP4, i.e., the maximum dimension of the set of line patterns in the X direction, which in this example is L2 or L3. In examples, the first line pattern LP1 has substantially a symmetrical shape with the fourth line pattern LP4 with respect to the center line. Also, the second line pattern LP2 has substantially a symmetrical shape with the third line pattern LP3 with respect to the center line. The set of line patterns, therefore, may have the same lengths as shown in FIG. 13A. Also, the distance spanned in the Y direction by the collection of four consecutively disposed line patterns LP1, LP2, LP3 and LP4 of each of the sets are substantially the same as the distance spanned in the Y direction by the collection of four consecutively disposed line patterns LP1, LP2, LP3 and LP4 of each of the other of the sets. Furthermore, the second trench LT2 has substantially a symmetrical shape with the fourth trench LT4 with respect to the center line. However, the inventive concept is not limited thereto.

In examples, the first to fourth trenches LT1, LT2, LT3 and LT4 may respectively have lengths L5, L6, L7 and L8, respectively, in the X direction. Here, the length L6 of the second trench LT2 may be greater than the length L5 of the first trench LT1, the length L7 of the third trench LT3 may be greater than the length L5 of the first trench LT1, and the length L8 of the fourth trench LT4 may be greater than the length L5 of the first trench LT1. In examples, the length L6 of the second trench LT2 may be substantially the same as the length L8 of the fourth trench LT4.

In examples, a line connecting pattern LCP may be connected to and contiguous with end portions of the first to fourth line patterns LP1, LP2, LP3 and LP4, and may extend in the Y direction. The line connecting pattern LCP may have side surfaces where the line connecting pattern LCP is exposed by end portions of the first to fourth trenches LT1, LT2, LT3 and LT4.

As also shown in FIG. 13C as an example, the line connecting pattern LCP may also have its respective ends at end portions of respective ones of the first line patterns LP1 (as shown in FIG. 13A) and may be symmetrical as between its ends with respect to a center line extending in the X direction through the center of the connecting pattern LCP (and the center of the plurality of line patterns LP) in the Y direction. Furthermore, a first boundary LCS1 where the line connecting pattern LCP meets the first line pattern LP1 may be spaced in the X direction from a second boundary LCS2 where the line connecting pattern LCP meets the second line pattern LP2. Furthermore, the first side boundary LCS1 and the second side boundary LCS2 may be located in different planes and in particular, may be offset from one another in the X direction.

Conventionally, when a plurality of parallel line patterns are formed by quadruple patterning technology (QPT), a line pattern unit of four consecutive line patterns is formed. In the line pattern repetition unit, an end portion of a first line pattern is connected to an end portion of a fourth line pattern, and an end portion of a second line pattern is connected to an end portion of a third line pattern. Therefore, an additional photolithography process may be required to connect all of the end portions of the first to fourth line patterns. However, according to an aspect of the inventive concept, the end portions of the first to fourth line patterns LP1, LP2, LP3 and LP4 are connected by the line connecting pattern LCP in the process of patterning the main pattern region MR obviating the need for an additional photolithography process to connect the end portions of the first to fourth line patterns is not performed.

Also, conventionally, a protective layer is formed in the peripheral circuit region PR to prevent damage to the peripheral circuit region PR during the process of patterning the main pattern region MR in the cell region CR. In general, a photolithography process is required to form the protective layer of the peripheral circuit region PR. In contrast to this conventional technique, according to an aspect of the present inventive concept, while the main pattern region MR in the cell region CR is patterned, the peripheral circuit region PR is covered by the second portion 142b of the first material layer 142 and the second portion 144b of the second mask layer 144 (refer back to the description of FIGS. 10A through 12C). That is, the peripheral circuit region PR can be prevented from being patterned or damaged by the process of patterning the cell region CR without the need to perform what would amount to an additional photolithography process for forming an additional layer dedicated to protecting the peripheral circuit region PR.

Thus, according to the inventive concept, the semiconductor device 100 including the plurality of line patterns LP and the line connecting pattern LCP having the shapes and arrangements described above may be obtained by a fabrication method in which relatively few photolithography processes are required.

FIGS. 14A to 17C illustrate other examples of a method of fabricating a semiconductor device 100A according to the inventive concept. Terms used in the description of these examples that follows, which are the same terms as those used above, will have the same meaning and therefore, definitions or meanings of such terms will not be duplicated below for the sake of brevity.

A fabrication method of the semiconductor device 100A is similar to a fabrication method of the semiconductor device 100 described referring to FIGS. 1A to 13C except with respect to the shapes of line patterns LPA which are formed, and therefore the above described difference will be the focus of description.

First, the processes described referring to FIGS. 1A to 4A may be performed.

Figure 14A:
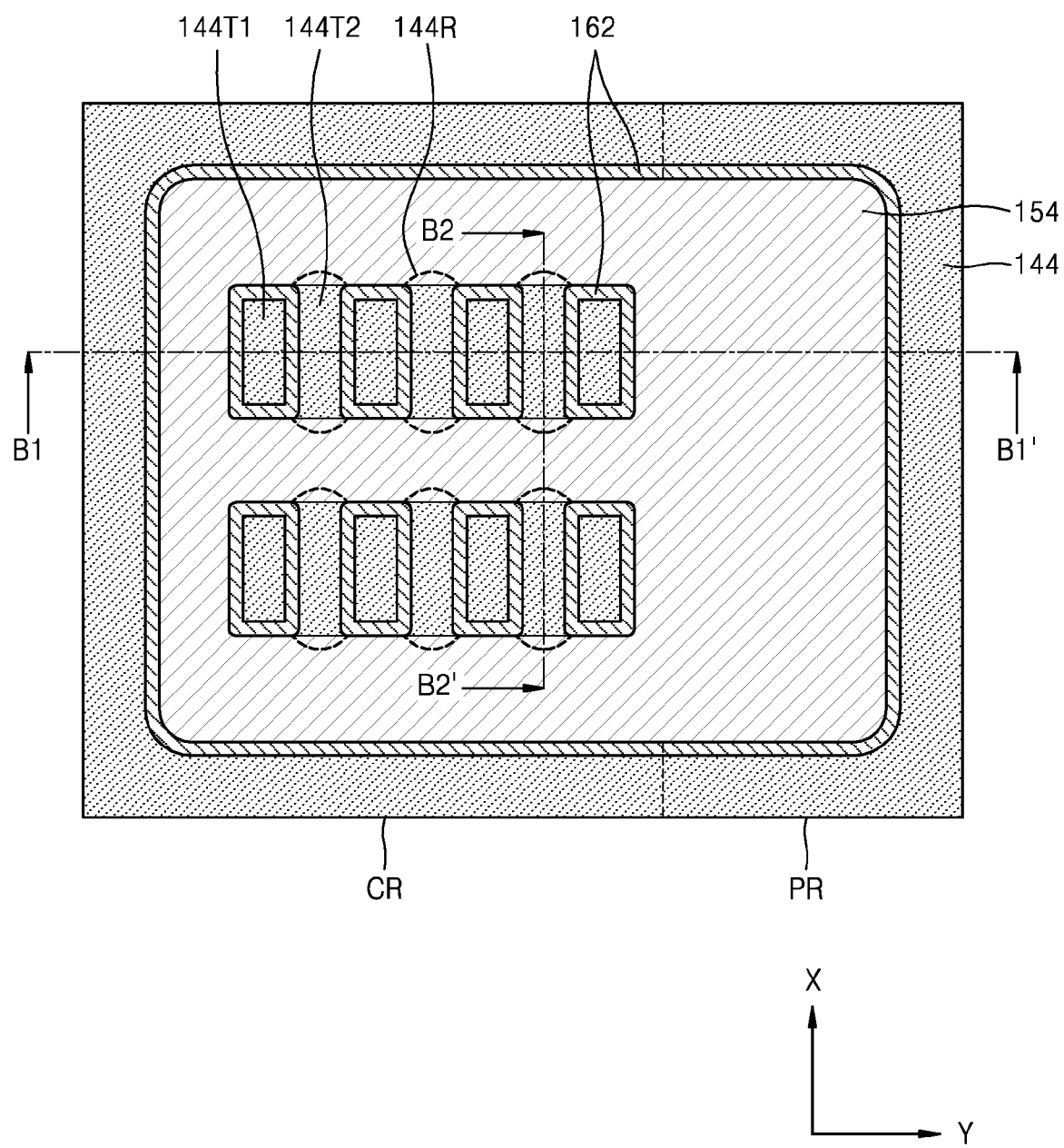
Figure 14B:
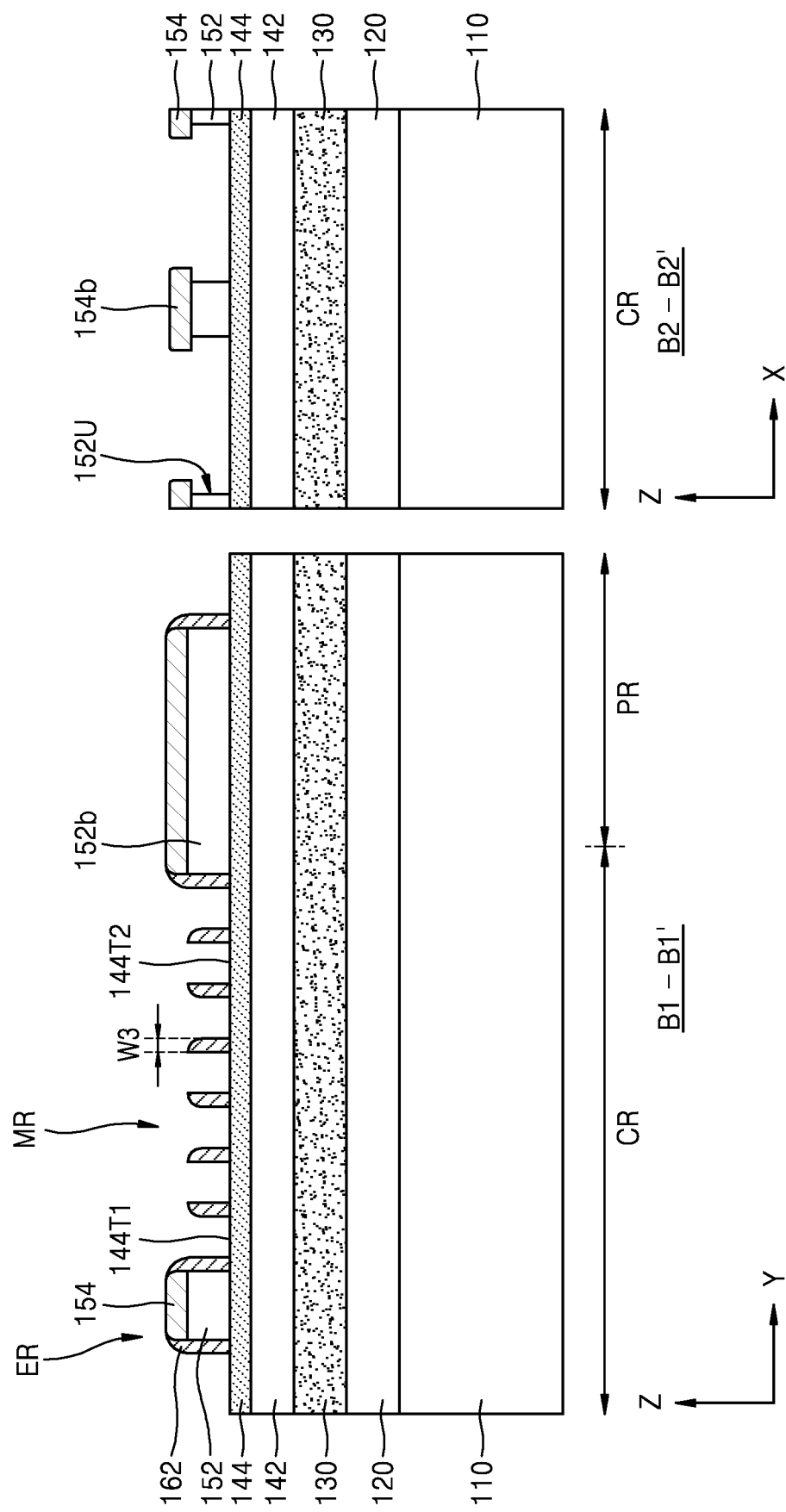
FIG. 14B, FIG. 15B, FIG. 16B, and FIG. 17B are cross-sectional views each taken along a line B1-B1' and a line B2-B2' in FIG. 14A, FIG. 15A, FIG. 16A, and FIG. 17A respectively.

Referring to FIGS. 14A and 14B, the first portion 152a of the second material layer 152 may be removed, and the second top surface 144T2 of the second mask layer 144 may be exposed. Here, in the removal process of the second material layer 152, the second material layer 152 may be further etched in a lateral direction, and as shown in FIG. 14B, an undercut 152U may be formed under the third mask layer 154. Furthermore, the second top surface 144T2 of the second mask layer 144 exposed under the second material layer 152 may have a rounded end portion 144R.

In examples, when the second material layer 152 includes an SOH material or an ACL material, the removal process of the second material layer 152 may be performed in an etching atmosphere in which the second material layer 152 has an isotropic etching property. Therefore, the second top surface 144T2 exposed under the second material layer 152 may be further extended in the lateral direction.

In other examples, in the etching atmosphere in which the second material layer 152 has an anisotropic etching property, the second material layer 152 may be over-etched and the second top surface 144T2 exposed under the second material layer 152 may be further extended in the lateral direction. In examples, the second material layer 152 may be removed by an anisotropic etching process such as an ion-beam etching process, a reactive ion etching process, a plasma etching process, a high density plasma etching process, or the like. For example, the etch process may be a directional plasma process using nitrogen and hydrogen, but the inventive concept is not limited thereto.

As shown in FIG. 14A, by forming the undercut 152U, an exposed portion of the second top surface 144T2 may be relatively long in the first direction (the X direction in FIG. 14A). When the first spacer 162 has a width of about 1F, a difference between a length of the exposed second top surface 144T2 in the X direction and a length of the first top surface 144T1 in the X direction may be greater than about 2F. For example, the difference between the length of the exposed second top surface 144T2 and the length of the first top surface 144T1 in the X direction may be about 4F, but the inventive concept is not limited thereto.

Figure 15A:
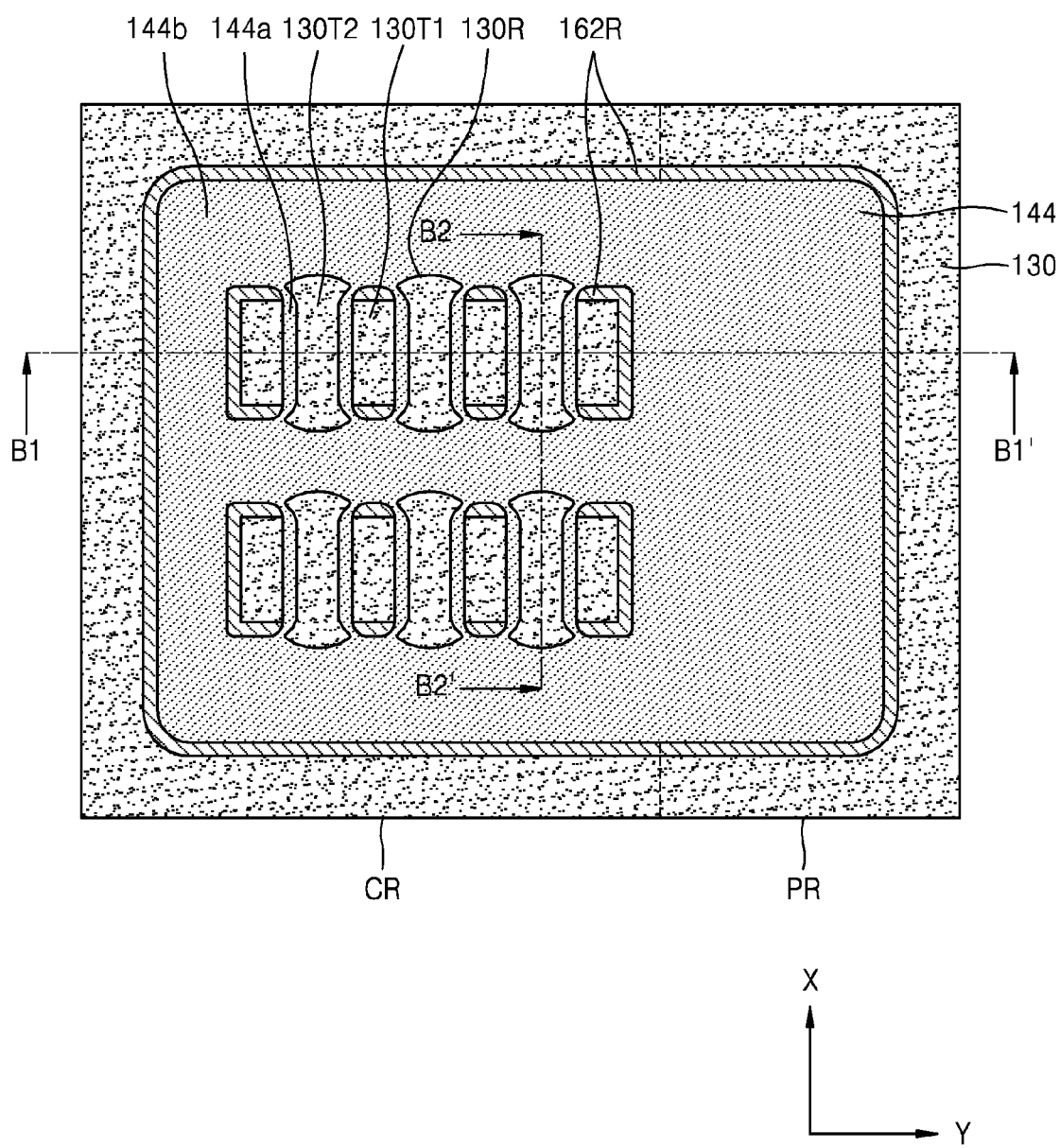
Figure 15B:
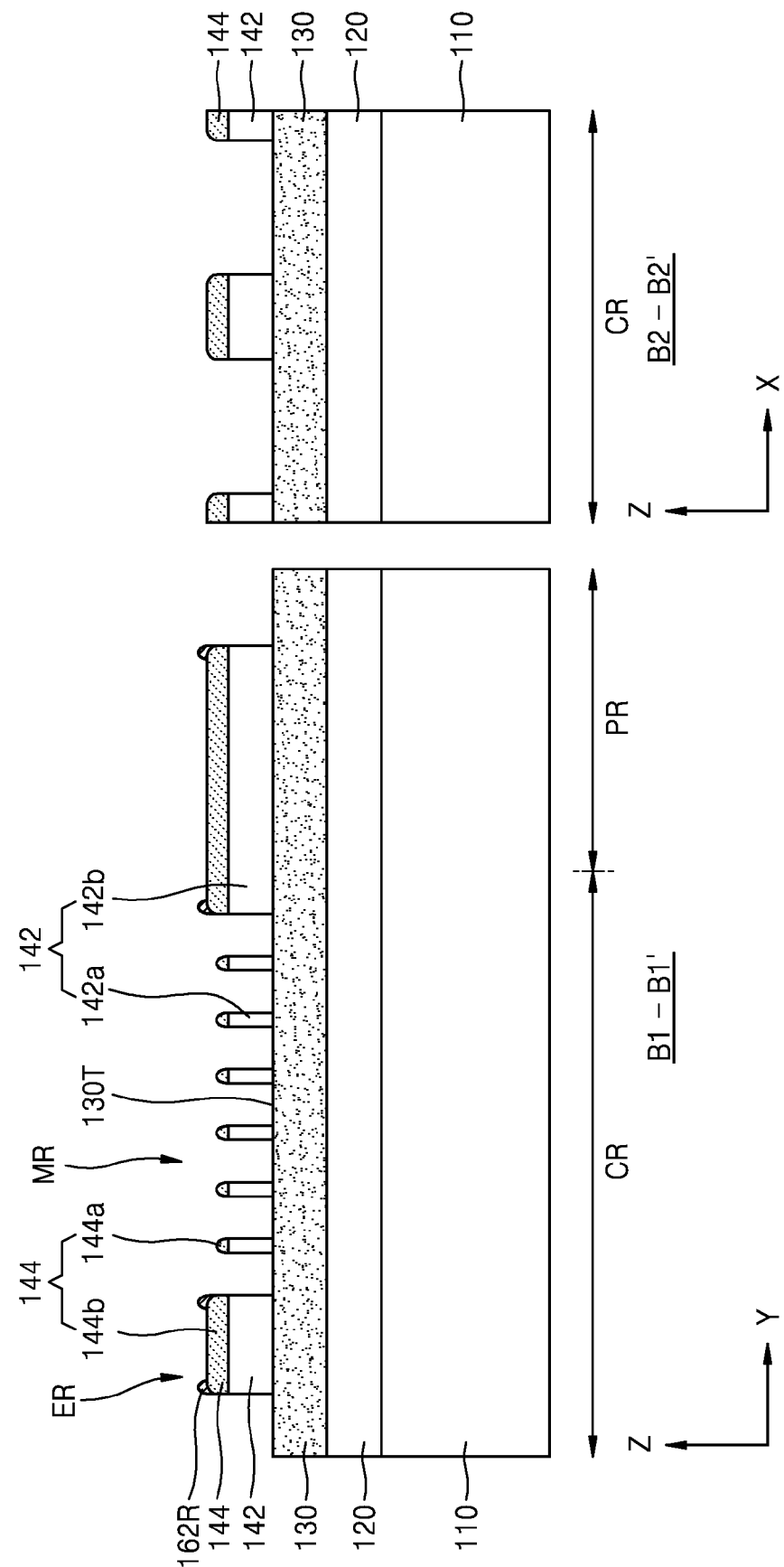

Referring to FIGS. 15A and 15B, the second mask layer 144 may be patterned using the third mask layer 154 (refer to FIG. 14B), the second portion 152b (refer to FIG. 14B) of the second material layer 152, and the first spacer 162 as the etching mask, and then the first material layer 142 may be patterned using the second mask layer 144 as the etching mask. Therefore, the first top surface 130T1 and the second top surface 130T2 of the first mask layer 130 may be exposed.

The first top surface 130T1 and the second top surface 130T2 of the first mask layer 130 may respectively have shapes corresponding to the first top surface 144T1 and the second top surface 144T2 (refer to FIG. 14B) of the second mask layer 144, and may be disposed at positions corresponding thereto. The second top surface 144T2 of the second mask layer 144 has the rounded end portion 144R (refer to FIG. 14B), and therefore the second top surface 130T2 of the first mask layer 130 may have a rounded end portion 130R.

Then, the processes described referring to FIGS. 7A to 10B may be performed.

Figure 16A:
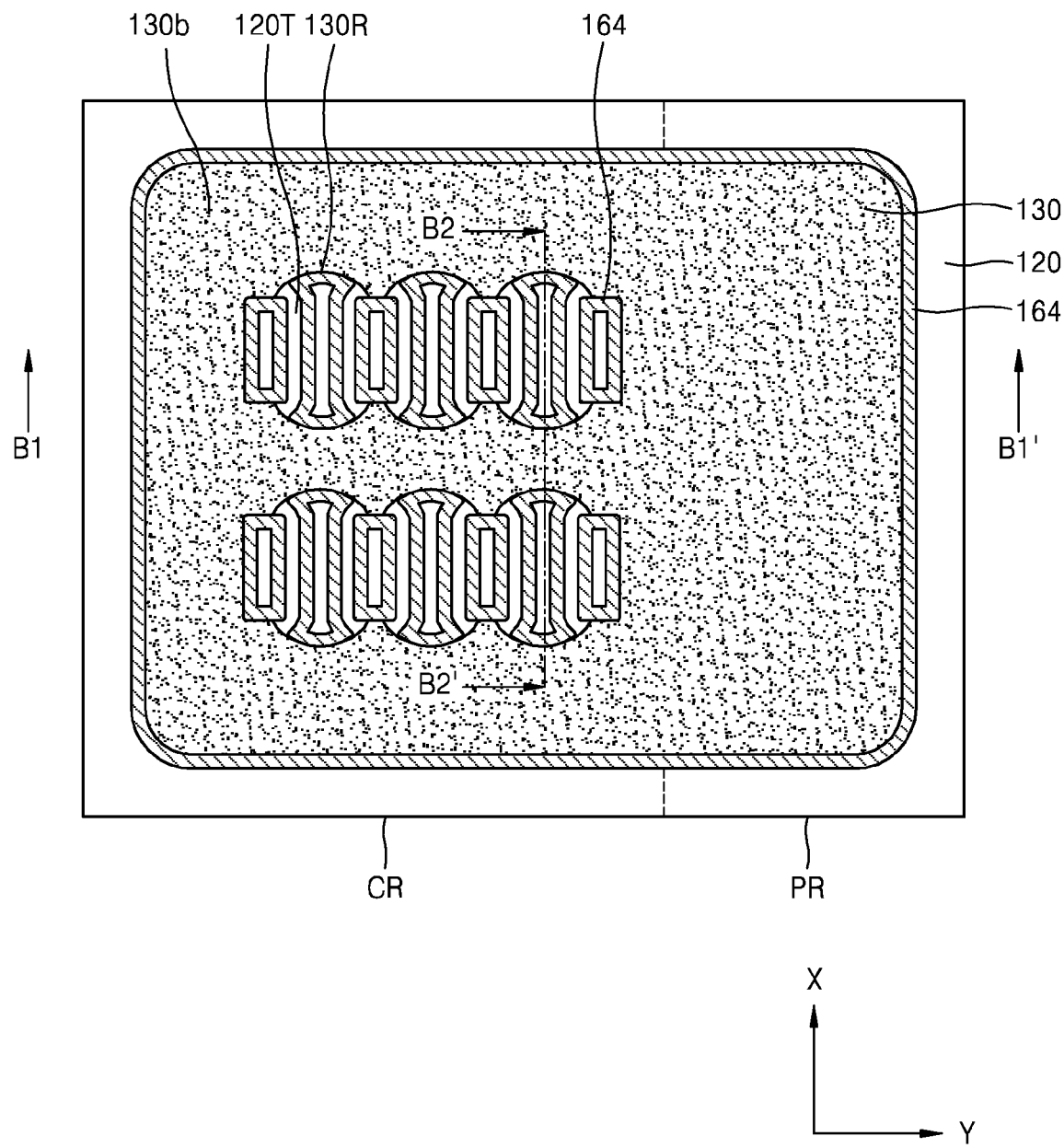
Figure 16B:
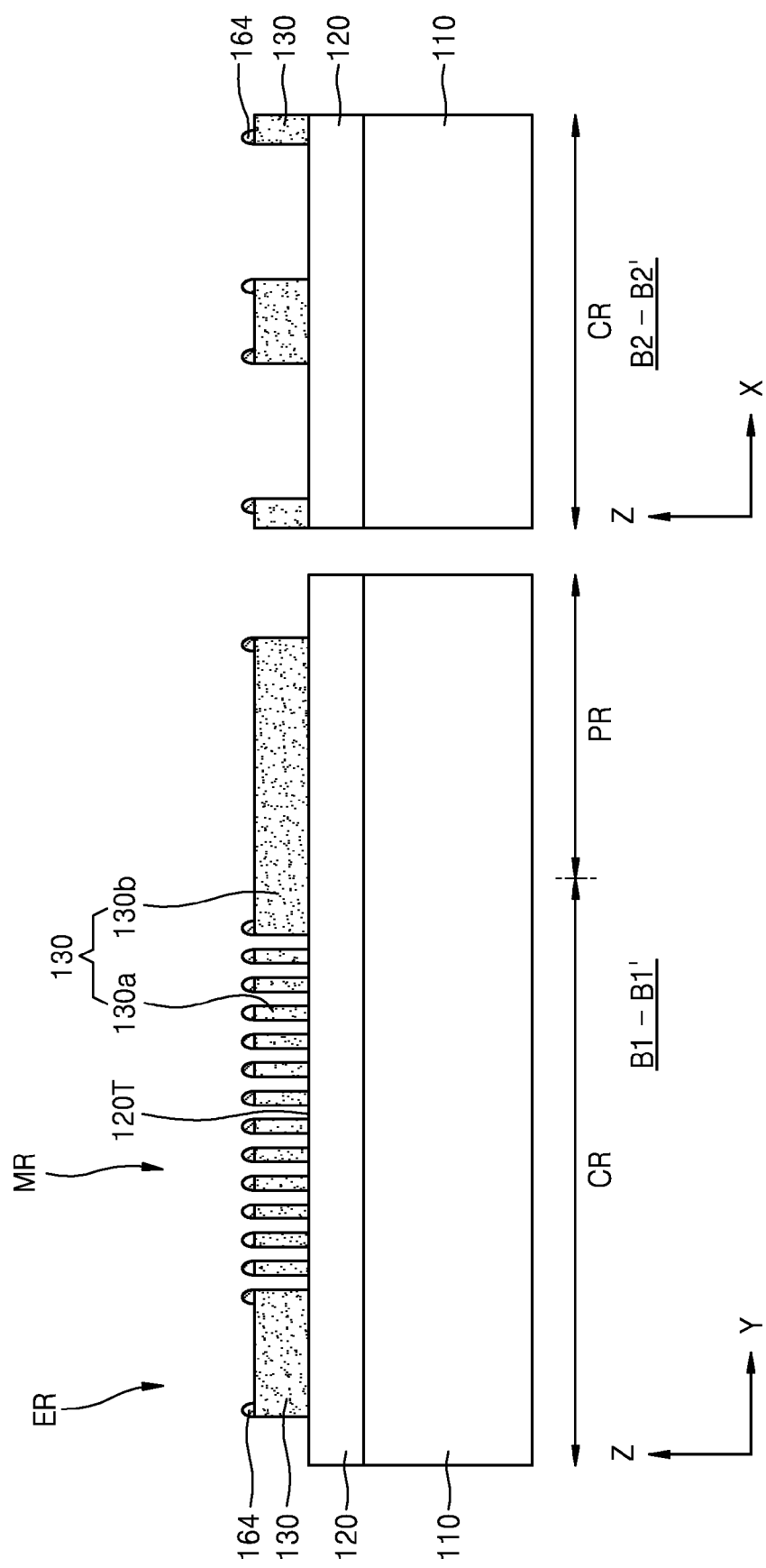

Referring to FIGS. 16A and 16B, the first portion 130a of the first mask layer 130 may be formed in the main pattern region MR, and the second portion 130b of the first mask layer 130 which has a relatively large width may be formed in the edge region ER. Meanwhile, the second portion 130b may have the rounded end portion 130R, and end portions of line patterns of the first portion 130a near the rounded end portion 130R may have a bent structure.

Figure 17A:
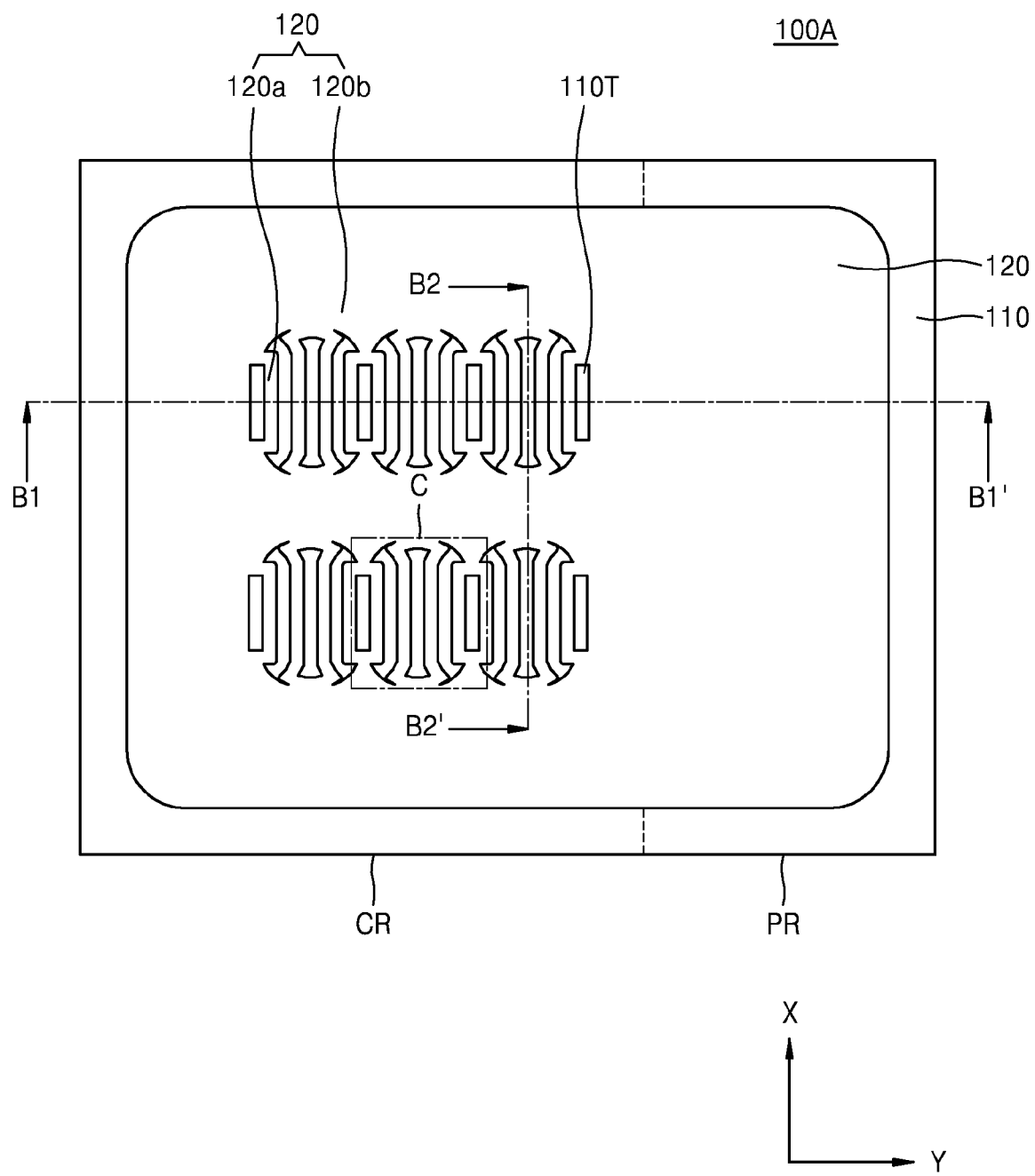
Figure 17B:
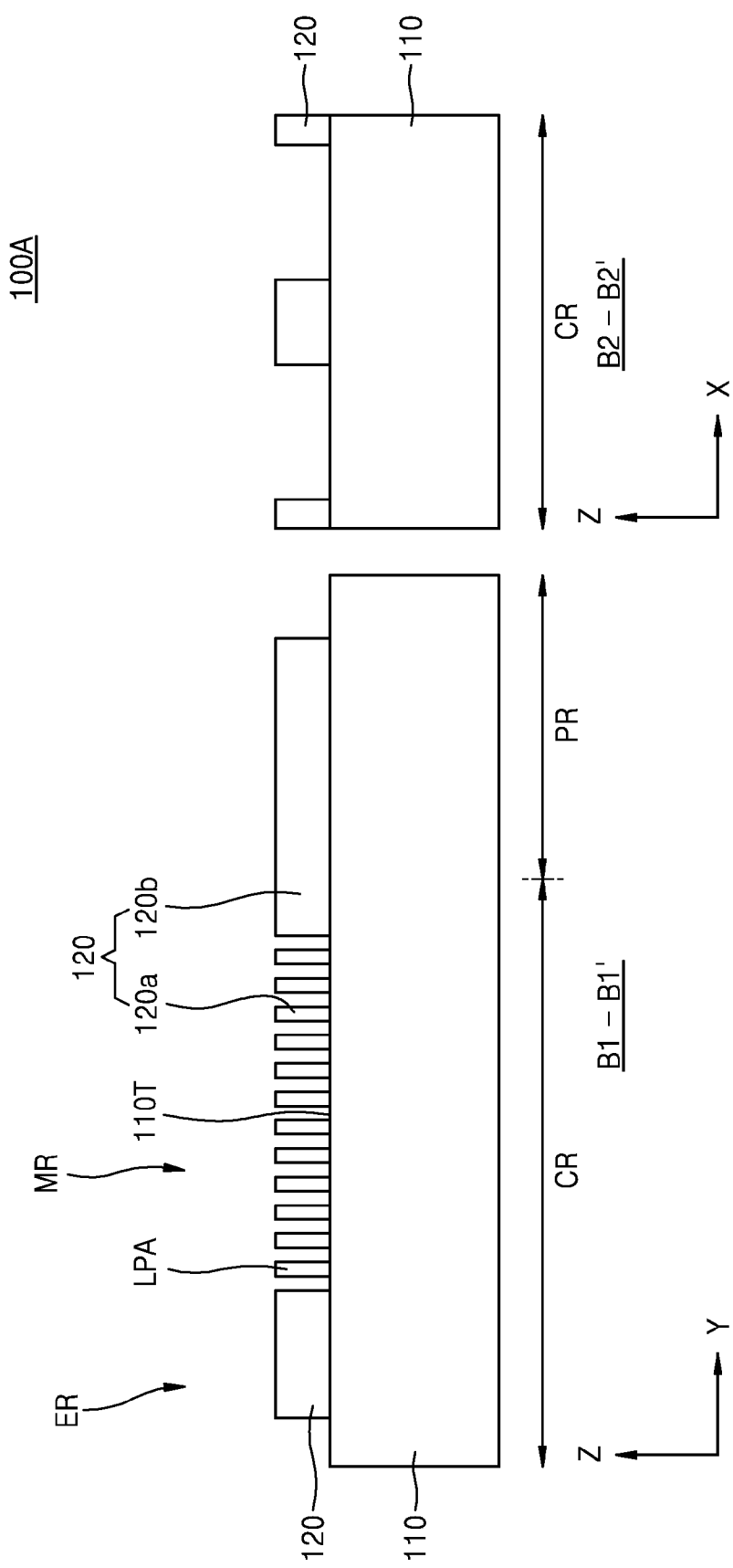
Figure 17C:
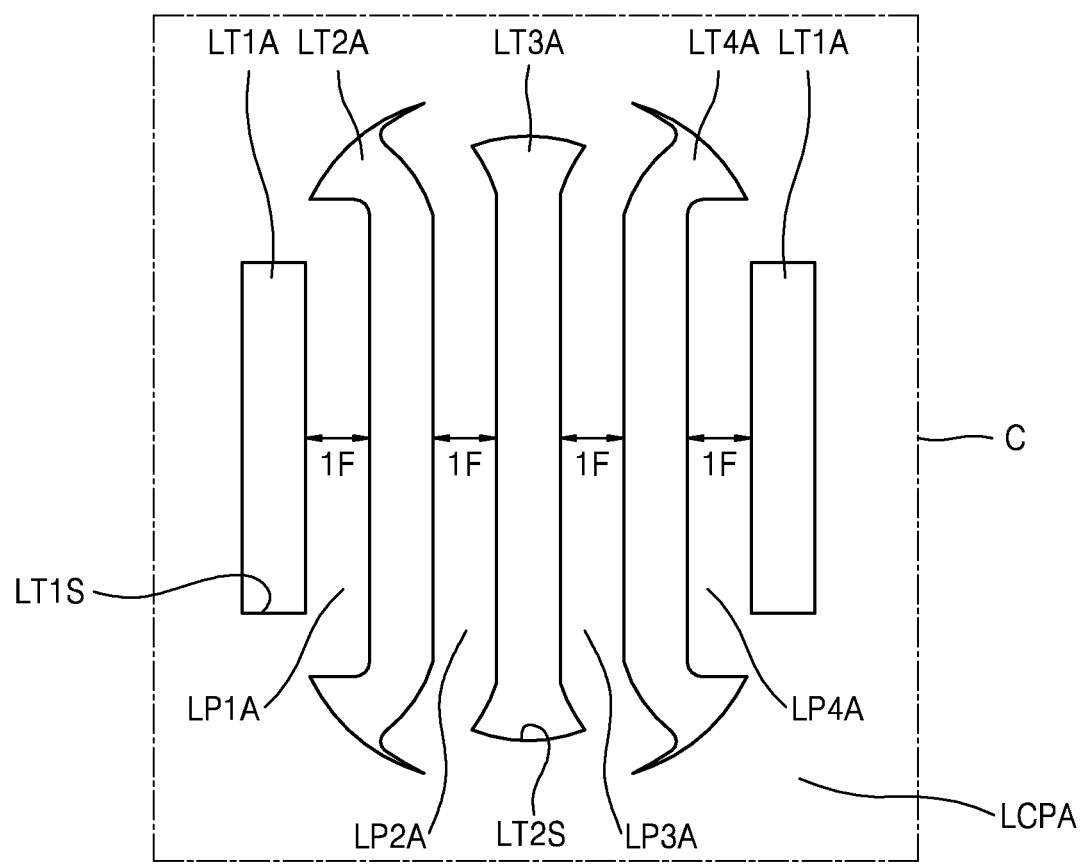

Referring to FIGS. 17A to 17C, the target layer 120 may be patterned using the first mask layer 130 as an etching mask, and a plurality of line patterns LPA may be formed on the main pattern region MR.

The plurality of line patterns LPA may include a plurality of line sets, and each line set may include four line patterns LPA consecutively disposed in the Y direction. In the line set, first to fourth line patterns LP1A, LP2A, LP3A and LP4A may be consecutively disposed in the Y direction. Furthermore, first to fourth trenches LT1A, LT2A, LT3A and LT4A may be consecutively disposed between adjacent ones of the first to fourth line patterns LP1A, LP2A, LP3A and LP4A.

Widths of each of the first to fourth line patterns LP1A, LP2A, LP3A and LP4A in the Y direction may be 1F, and the first to fourth line patterns LP1A, LP2A, LP3A and LP4A may be separated by a spacing of 1F. In examples, the first line pattern LP1A has substantially a symmetrical shape with the fourth line pattern LP4A with respect to a center line extending in the X direction, and the second line pattern LP2A has substantially a symmetrical shape with the third line pattern LP3A with respect to the center line. Furthermore, the second trench LT2A has substantially a symmetrical shape with the fourth trench LT4A with respect to the center line. However, the inventive concept is not limited thereto.

In examples, a line connecting pattern LCPA may be connected to end portions of the first to fourth line patterns LP1A, LP2A, LP3A and LP4A, and may extend in the Y direction. The line connecting pattern LCPA may include a side wall exposed by the end portions of the first to fourth trenches LT1A, LT2A, LT3A and LT4A.

As shown in FIG. 17A as an example, the line connecting pattern LCPA may have substantially a symmetrical shape with respect to a center line extending in the X direction through its center (and the center of each of the groups of the plurality of line patterns LPA). A side surface of the line connecting pattern LCPA may be exposed by the end portions of the first to fourth trenches LT1A, LT2A, LT3A and LT4A. A first side surface section LT1S of the line connecting pattern LCPA exposed by the first trench LT1A may be offset in the X direction relative to a second side surface section LT2S of the line connecting pattern LCPA exposed by the third trench LT3A.

The semiconductor device 100A including the plurality of line patterns LPA and the line connecting pattern LCPA having the shapes and arrangements described above may be obtained by a fabrication method of the semiconductor device 100A according to the inventive concept in which relatively few photolithography processes are required. According to the inventive concept, in the process of patterning the main pattern region MR, the end portions of the first to fourth line patterns LP1A, LP2A, LP3A and LP4A may be connected to the line connecting pattern LCPA during a patterning process for forming the line patterns thereby obviating the need for an additional photolithography process to connect the end portions of the first to fourth line patterns.

Furthermore, although an additional photolithography process to form the protective layer of the peripheral circuit region PR is not performed, in the process of patterning the cell region CR, the peripheral circuit region PR may be prevented from being patterned or damaged by the patterning process.

Figure 18:
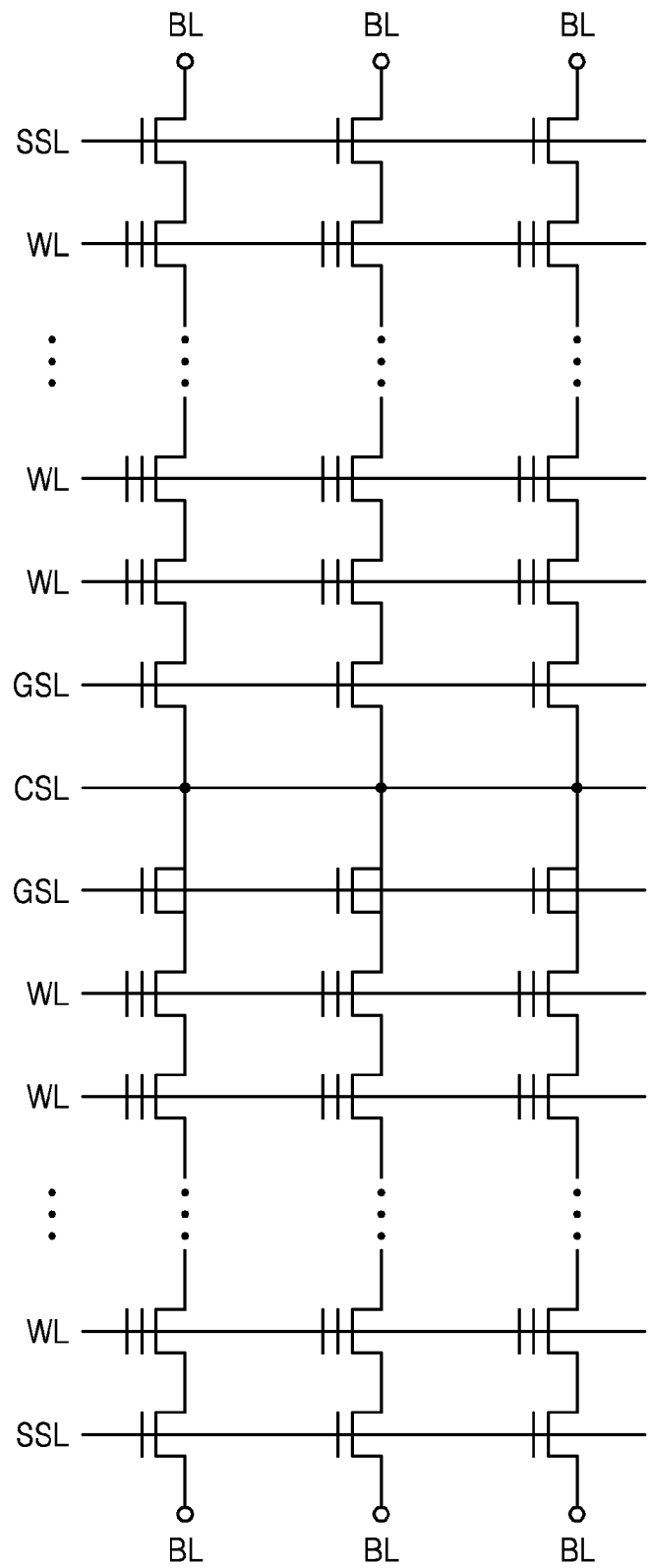
FIG. 18 is a circuit diagram illustrating examples of a memory cell array according to the inventive concept.
Figure 19A:
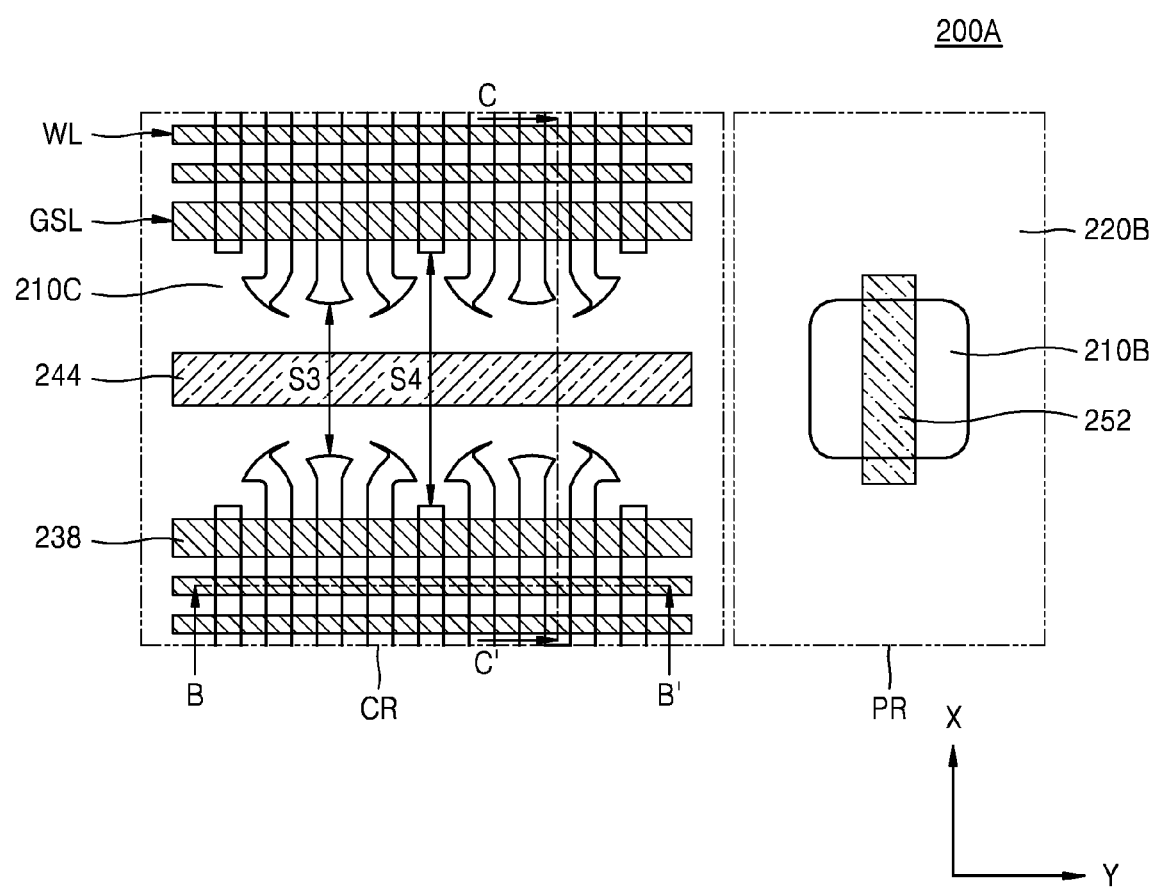
FIG. 19A is a plan view of examples of a semiconductor device according to the inventive concept.
Figure 19B:
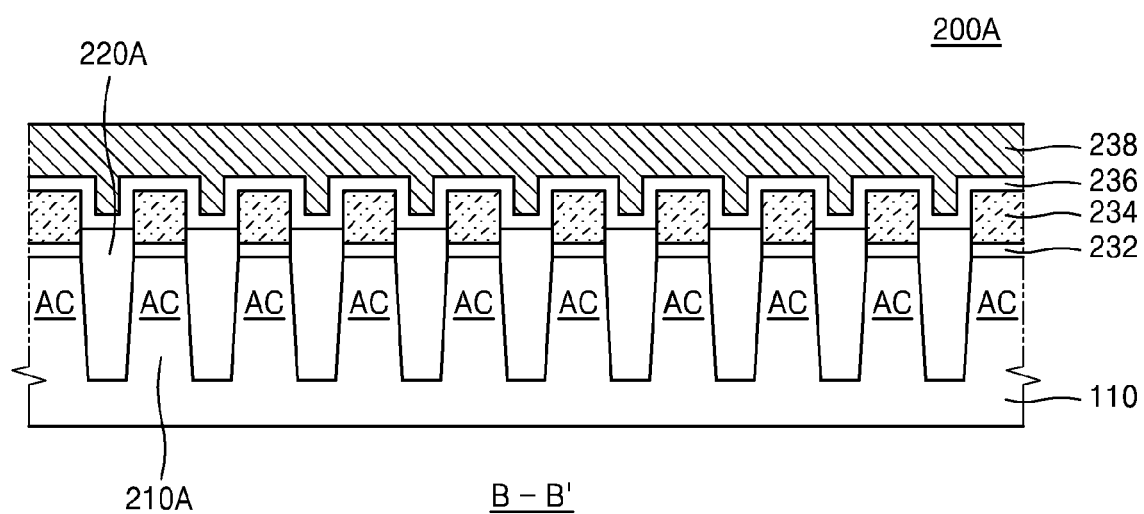
FIGS. 19B to 19C are cross-sectional views taken along lines B-B' and C-C' of FIG. 19A, respectively.
Figure 19C:
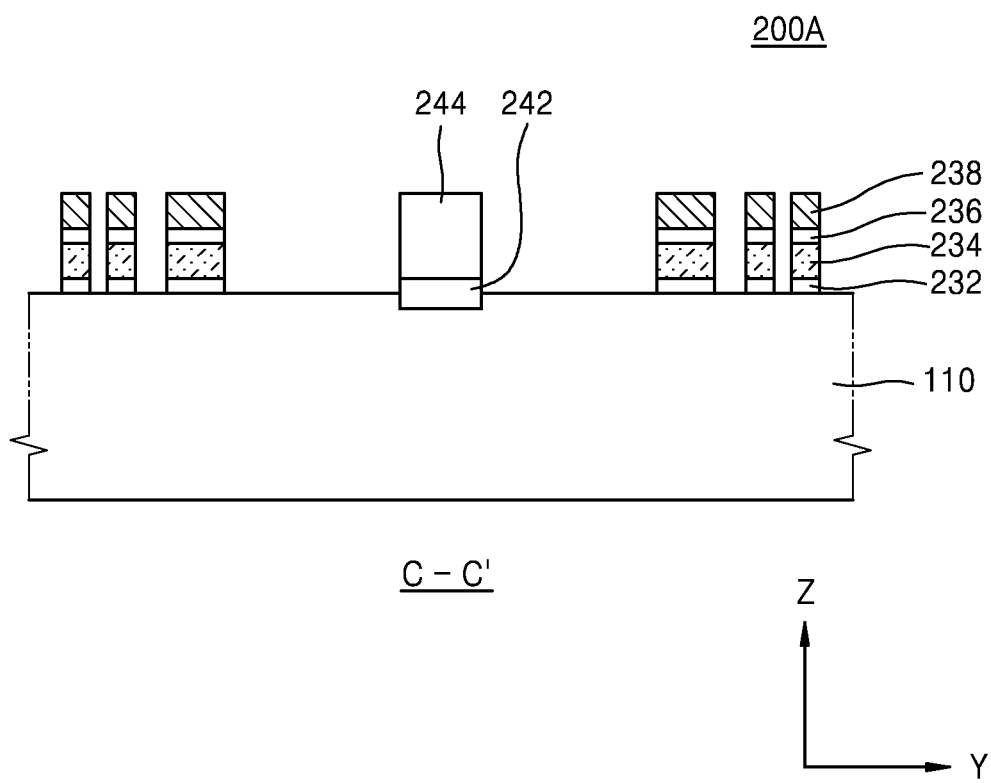

FIG. 18 is a circuit diagram illustrating examples of a memory cell array 200 according to the inventive concept. In FIG. 18, an equivalent circuit of the memory cell array 200 of a NAND flash memory device is shown as example. FIGS. 19A to 19C are plan views and cross-sectional views illustrating examples of a semiconductor device 200A according to the inventive concept.

Referring to FIGS. 18 to 19C, the memory cell array 200 may include an active region and a trench isolation structure which divides the active region into what may be considered to be a plurality of active regions spaced in a given direction from one another. That is, a plurality of active regions AC may be defined by a plurality of isolation regions 220A in the cell region CR. The isolation regions 220A may be discrete portions of insulating material. The plurality of active regions AC may include line patterns, i.e., may have linear sections, parallel to each other. The line patterns of the active regions AC may be spaced from each other in the Y direction.

A string selection line SSL and a ground selection line GSL crossing an upper portion of the plurality of active regions AC may be located on the plurality of active regions AC. A plurality of word lines WL crossing the upper portion of the plurality of active regions AC may be disposed between the string selection line SSL and the ground selection line GSL. The string selection line SSL, the ground selection line GSL, and the word lines WL may be parallel to each other.

A plurality of impurity regions (not shown) may be formed in the plurality of active regions AC adjacent to both sides of the plurality of word lines WL, the string selection line SSL, and the ground selection line GSL. Therefore, a string selection transistor, memory cell transistors, and a ground selection transistor connected in series may be formed. The string selection transistor, the ground selection transistor, and the memory cell transistors located between the string selection transistor and the ground selection transistor may collectively form a memory string.

A plurality of active regions AC adjacent to the string selection line SSL and located opposite the ground selection line GSL may be a drain region of the string selection line SSL. Furthermore, a plurality of active regions AC adjacent to the ground selection line GSL and located opposite the string selection line SSL may be a source region of the ground selection transistor.

The plurality of word lines WL may each extend in a direction crossing the plurality of active regions AC. The plurality of word lines WL may include a tunnel insulating layer 232, a charge storage layer 234, a block insulating layer 236, and a gate electrode layer 238 sequentially stacked on the substrate 110.

The tunnel insulating layer 232 and the charge storage layer 234 may have a separate structure with respect to adjacent memory cell transistors in the longitudinal direction of the word lines WL.

The tunnel insulating layer 232 may include silicon oxide, silicon oxynitride, silicon oxide doped with an impurity, or a low-k dielectric material (dielectric material having a smaller dielectric constant than the silicon oxide). The charge storage layer 234 may be a charge trap layer or a conductive layer. The charge storage layer 234 may include a doped semiconductor material, e.g., doped polysilicon. The charge storage layers 234 may be electrically insulated from each other by the tunnel insulating layer 232 and the block insulating layer 236.

The block insulating layer 236 may be shared by adjacent memory cell transistors in the longitudinal direction of the word lines WL. The block insulating layer 236 may have a stacked structure including silicon oxide, silicon oxynitride, or a combination thereof. In some examples, the block insulating layer 236 may include an oxide-nitride-oxide (ONO) film. Furthermore, the block insulating layer 236 may include a high-k dielectric material (dielectric material having a greater dielectric constant than silicon oxide).

The gate electrode layer 238 may be an electrode controlling a program operation and an erase operation. The gate electrode layer 238 may be formed to be mutually connected between cell transistors adjacent in the longitudinal direction of the word lines WL. In some examples, the gate electrode layer 238 may be a conductive layer including a doped semiconductor, a metallic silicide, or a combination thereof. For example, the gate electrode layer 238 may include doped polysilicon.

At least one of the string selection line SSL and the ground selection line GSL may have a stacked structure the same as the stacked structure of the plurality of word lines WL in a region crossing the plurality of active regions AC. In some examples, the charge storage layer 234 and the gate electrode layer 238 may be electrically connected. Widths of the string selection line SSL and the ground selection line GSL may be greater than a width of each of the word lines WL. However, the inventive concept is not limited thereto.

As illustrated in FIG. 18, the memory cell array 200 may include a plurality of bit lines BL crossing the upper portion of the plurality of word lines WL. The plurality of bit lines BL may be connected to a drain region of the string selection line SSL through a bit line contact (not shown). The bit lines BL may run parallel to the active regions AC.

End portions of the active regions AC may be contiguous with, i.e., connected to, a common source line region 210C. On the common source line region 210C, a common source line 244 may extend parallel to the longitudinal direction of the word lines WL. A common source line contact 242 may be disposed between the common source line 244 and the common source line region 210C. The common source line contact 242 may include a metallic silicide. The common source line region 210C is connected to the end portions of the plurality of active regions AC and has a relatively large area, and therefore an area of the common source line contact 242 may be large. Therefore, a resistance and signal noise of the common source line 244 may be corresponding small, and accordingly the semiconductor device 200A may have an excellent electrical property.

The configuration of the plurality of active regions AC illustrated in FIGS. 19A to 19C may be the same as the configuration of the plurality of line patterns LP described referring to FIGS. 1A to 13C, the configuration of the plurality of line patterns LPA described referring to FIGS. 14A to 17C, or any other configuration within the scope of the inventive concept.

The plurality of isolation regions 220A illustrated in FIGS. 19A to 19C may include a plurality of isolation region sets, and each isolation region set may include four isolation regions consecutively disposed in the first direction (the X direction) and having lengths which vary, similar to the plurality of trenches LT1, LT2, LT3 and LT4 described referring to FIGS. 1A to 13C or the plurality of trenches LT1A, LT2A, LT3A and LT4A described referring to FIGS. 14A to 17C.

In the peripheral circuit region PR of the substrate 110, a peripheral circuit active region 210B defined by an isolation region 220B may be formed. A gate electrode 252 may be disposed on the peripheral circuit active region 210B. The peripheral circuit active region 210B may be independently formed after a process in which the plurality of active regions AC are formed in the cell region CR, or simultaneously formed with the process in which the plurality of active regions AC are formed in the cell region CR.

Although the inventive concept has been particularly shown and described with reference to examples thereof, it will be understood that various changes in form and details may be made to the examples without departing from the spirit and scope of the inventive concept as defined by the following claims.

What is claimed is:
1. A semiconductor device comprising:
a plurality of line patterns, all of the line patterns extending longitudinally in a first direction so as to each have a length in the first direction, and the line patterns spaced from each other in a second direction perpendicular to the first direction,
wherein the plurality of line patterns include at least two respective sets of the line patterns, each of the sets including four of the line patterns consecutively disposed in the second direction,
the lengths of the line patterns in each of the sets vary,
the sets of line patterns have substantially identical lengths,
the four respective line patterns of each of the sets of line patterns are a first line pattern, a second line pattern, a third line pattern, and a fourth line pattern which are consecutively arranged in the second direction, and
the length of the second line pattern is greater than the length of the first line pattern, the length of the third line pattern is greater than the length of the first line pattern, and the length of the fourth line pattern is less than the length of the third line pattern.

2. The semiconductor device of claim 1, wherein the length of the second line pattern is substantially the same as the length of the third line pattern.

3. The semiconductor device of claim 1, wherein the length of the fourth line pattern is substantially the same as the length of the first line pattern.

4. The semiconductor device of claim 1, wherein in each of the sets of line patterns, the first line pattern and the fourth line pattern are substantially symmetrical to one another with respect to a center line extending in the first direction through the center, in the second direction, of the set of first, second, third and fourth line patterns.

5. The semiconductor device of claim 1, wherein in each of the sets of line patterns, the second line pattern and the third line pattern are substantially symmetrical to one another with respect to a center line extending in the first direction through the center, in the second direction, of the set of first, second, third and fourth line patterns.

6. The semiconductor device of claim 1, further comprising:
a line connecting pattern connected to ends of the first to fourth line patterns, of each of the sets of line patterns, and extending in the second direction.

7. The semiconductor device of claim 1, and having a plurality of trenches, each of the trenches extending longitudinally in the first direction and interposed between two respective ones of the line patterns that are adjacent one another in the second direction, and
wherein the plurality of trenches includes at least two respective sets of the trenches, each of the sets of trenches including four of the trenches consecutively disposed in the second direction, the lengths of the trenches in each of the sets thereof varying, and
the sets of trenches have substantially identical lengths.

8. A semiconductor device comprising:
a plurality of isolation regions defining a plurality of line-shaped active regions, all of the active regions extending longitudinally in a first direction so as to each have a length in the first direction,
wherein the plurality of active regions includes at least two respective sets of the active regions, and each of the sets of active regions includes four of the active regions consecutively disposed in a second direction perpendicular to the first direction,
the lengths of the active regions in each of the sets thereof vary,
the sets of active region have substantially identical lengths,
the four respective active regions of each of the sets of active regions are a first active region, a second active region neighboring the first active region, a third active region neighboring the second active region, and a fourth active region neighboring the third active region, and
the length of the second active region is greater than the length of the first active region, the length of the third active region is greater than the length of the first active region, and the length of the fourth active region is less than the length of the third active region.

9. The semiconductor device of claim 8, wherein the length of the second active region is substantially the same as the length of the third active region.

10. The semiconductor device of claim 8, wherein the length of the fourth active region is substantially the same as the length of the first active region.

11. The semiconductor device of claim 8, wherein the first active region and the fourth active region are substantially symmetrical to one another with respect to a center line extending in the first direction through the center, in the second direction, of the set of first, second, third and fourth active regions.

12. The semiconductor device of claim 8, wherein the second active region and the third active region are substantially symmetrical to one another with respect to a center line extending in the first direction through the center, in the second direction, of the set of first, second, third and fourth active regions.

13. The semiconductor device of claim 8, further comprising:
a common source line region connected to ends of the first to fourth active regions, of each of the sets of active regions, and extending in the second direction.

14. A semiconductor device comprising a memory cell array and a peripheral circuit transistor disposed laterally of the memory cell array,
wherein the memory cell array includes an active region and a trench isolation region, the active region having at least one group of parallel linear sections each of which extends longitudinally in a first direction and is delimited by two linear side portions of the trench isolation region, the linear sections of the active regions being spaced from one another in a second direction perpendicular to the first direction, and the group of the linear sections of the active region including at least two respective sets of the linear sections,
the sets have identical configurations of four of the linear sections of the active region consecutively disposed in the second direction, and
the lengths of the side portions of the trench isolation region delimiting the four linear sections, in each set thereof, varying, such that a length of at least one of the four linear sections in each set thereof differs from a length of at least one of the other linear sections in the set,
the trench isolation region comprises first, second, third, fourth and fifth discrete sections of insulating material consecutively disposed in the foregoing order and delimiting the four linear sections of each of the sets thereof,
the first and the fifth discrete sections of insulating material are symmetrical to one another about a center line extending in the first direction and passing through a center of the third discrete section, and
the second and the fourth discrete sections of insulating material have shapes different from those of the first and fifth discrete sections and are symmetrical to one another about the center line.

15. The semiconductor device of claim 14, wherein each of the discrete sections of insulating material of the trench isolation region is interposed between respective ones of the linear sections of the active region consecutively disposed in the second direction, and
  each of the discrete sections of insulating material has the shape of a quadrangle as viewed in plan.

16. The semiconductor device of claim 14, wherein each of the discrete sections of insulating material of the trench isolation region is interposed between respective ones of the linear sections of the active region consecutively disposed in the second direction, and
  some of the discrete sections of insulating material have curved end surfaces.

17. The semiconductor device of claim 14, wherein the at least one group comprises two groups of parallel linear sections of the active region, and
  the active region also has a line connecting portion extending between said groups and contiguous with all of the linear sections of the groups at respective ends of the linear sections, and further comprising:
  a common source line extending longitudinally on the connecting line portion in the second direction as interposed between the groups of linear sections of the active region, as viewed in plan.

* * * * *